United States Patent
Ha et al.

(10) Patent No.: US 11,643,525 B2
(45) Date of Patent: May 9, 2023

(54) ELECTRONIC DEVICE WITH SELF-HEALING PROPERTIES

(71) Applicant: KOREA UNIVERSITY RESEARCH AND BUSINESS FOUNDATION, Seoul (KR)

(72) Inventors: Jeongsook Ha, Seoul (KR); Jungwook Kim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 302 days.

(21) Appl. No.: 17/012,348

(22) Filed: Sep. 4, 2020

(65) Prior Publication Data
US 2021/0095101 A1 Apr. 1, 2021

(30) Foreign Application Priority Data
Sep. 27, 2019 (KR) .......................... 10-2019-0119338

(51) Int. Cl.
| H05K 1/03 | (2006.01) |
| C08L 1/04 | (2006.01) |
| C08B 15/02 | (2006.01) |
| C08L 29/04 | (2006.01) |
| H01G 4/015 | (2006.01) |

(52) U.S. Cl.
CPC .............. *C08L 1/04* (2013.01); *C08B 15/02* (2013.01); *C08L 29/04* (2013.01); *H01G 4/015* (2013.01); *H05K 1/036* (2013.01); *H05K 1/0353* (2013.01); *C08L 2203/20* (2013.01); *H05K 2201/0104* (2013.01)

(58) Field of Classification Search
CPC ................... H05K 1/0353–0373; H05K 1/036
See application file for complete search history.

(56) References Cited

U.S. PATENT DOCUMENTS

2011/0126408 A1* 6/2011 Antesberger ...... H01L 23/49833
29/846
2019/0110363 A1* 4/2019 Bao ........................ H01R 12/00

FOREIGN PATENT DOCUMENTS

| KR | 10-1184750 B1 | 9/2012 |
| KR | 10-2012-0115674 A | 10/2012 |
| KR | 10-1582768 B1 | 1/2016 |
| KR | 10-1744133 B1 | 6/2017 |
| KR | 10-1882128 B1 | 8/2018 |

(Continued)

OTHER PUBLICATIONS

Zhang, Hongji et al., "Poly(vinyl alcohol) Hydrogel Can Autonomously Self-heal", *ACS Macro Letters*, 1, 11, Oct. 9, 2012 (pp. 1233-1236).

(Continued)

*Primary Examiner* — Jeremy C Norris
(74) *Attorney, Agent, or Firm* — NSIP Law

(57) ABSTRACT

An electronic device with self-recovering properties including a substrate including a polymer composite, a conductive pattern disposed on the substrate, and an electrode disposed on the conductive pattern is provided, and the polymer composite includes a composite of different first and second polymers, the first polymer includes a first functional group capable of forming a hydrogen bond between polymer chains, and the second polymer includes a second functional group capable of forming a hydrogen bond between polymer chains.

8 Claims, 33 Drawing Sheets

(56) References Cited

FOREIGN PATENT DOCUMENTS

| KR | 10-2004645 B1 | 7/2019 |
|---|---|---|
| KR | 10-2007603 B1 | 8/2019 |

OTHER PUBLICATIONS

Hou, Chengyi et al., "A strong and stretchable self-healing film with self-activated pressure sensitivity for potential artificial skin applications", *Scientific Reports*, vol. 3, Article No. 3138, Nov. 5, 2013 (pp. 1-22).

Yang, Zhibin et al., "A Highly Stretchable, Fiber-Shaped Supercapacitor", *Angewandte Chemie International Edition*, vol. 52, Issue 50, Dec. 9, 2013 (pp. 1-5).

Wang, Hua et al., "A Mechanically and Electrically Self-Healing Supercapacitor", *Advanced Materials*, vol. 26, Issue 22, Feb. 19, 2014 (1 page in English).

Meng, Qinghai et al., "Thread-like supercapacitors based on one-step spun nanocomposite yarns", *Small*, 10(15), 2014, (pp. 3187-3193).

Pu, Xiong et al., "Wearable Self-Charging Power Textile Based on Flexible Yarn Supercapacitors and Fabric Nanogenera, tors", *Advanced Materials*, vol. 28, Issue 1, Jan. 6, 2016 (pp. 1-8).

Lu, Beili et al., "One-Pot Assembly of Microfibrillated Cellulose Reinforced PVA-Borax Hydrogels with Self-Healing and pH-Responsive Properties", *ACS Sustainable Chem. Eng.*, 5, 1, Nov. 19, 2016 (pp. 948-956).

Liu, Rong et al., "A flexible polyaniline/graphene/bacterial cellulose supercapacitor electrode", *New Journal of Chemistry*, Issue 2, 2017 (pp. 1-8).

J.De France, Kevin et al., "Review of Hydrogels and Aerogels Containing Nanocellulose", *Chemistry of Materials*, 29, 11, Apr. 16, 2017 (pp. 4609-4631).

Tong, Yu-Long et al., "Microfluidic-Spinning-Directed Conductive Fibers toward Flexible MicroSupercapacitors", *Macromolecular Materials and Engineering*, vol. 303, Issue 6, Jun. 2018, (pp. 1-9).

Yan, Xuzhou et al., "Quadruple H-Bonding Cross-Linked Supramolecular Polymeric Materials as Substrates for Stretchable, Antitearing, and Self-Healable Thin Film Electrodes", *J. Am. Chem. Soc*, 140, 15, 2018 (pp. 5280-5289).

Zou, Yubo et al., "Hydrothermal direct synthesis of polyaniline, graphene/polyaniline and N-doped graphene/polyaniline hydrogels for high performance flexible supercapacitors", *Journal of Materials Chemistry A*, Issue 19, 2018 (pp. 1-12).

Kim, Jung Wook et al., "Paper-Like, Thin, Foldable, and Self-Healable Electronics Based on PVA/CNC Nanocomposite Film", *Advanced Functional Materials*, vol. 29, Issue 50, Dec. 12, 2019 (pp. 1-14).

* cited by examiner

ELECTRONIC DEVICE WITH SELF-HEALING PROPERTIES

STATEMENT REGARDING GOVERNMENT SPONSORED RESEARCH OR DEVELOPMENT

The present invention is derived from a study (Detailed task number: NRF-2019R1A2B5B03069545, Research management institution: Korea Research Foundation, Project Title: Fabrication of 3-dimensional stretchable devices with embedded supercapacitor array for power dressing, Organizer: Korea University Industry-Academic Cooperation Foundation, Research Period: 2019.06.01~2022.02.28, Contribution Rate: 1) conducted as part of a 'Mid-Level Follow-Up Study' of the Ministry Of Science And ICT in Korea. There is no property interest of the Korean government in any aspect of this invention.

CROSS-REFERENCE TO RELATED APPLICATIONS

A claim for priority under 35 U.S.C. § 119 is made to Korean Patent Application No. 10-2019-0119338 filed on Sep. 27, 2019, in the Korean Intellectual Property Office, the entire contents of which are hereby incorporated by reference.

BACKGROUND

Embodiments of the inventive concept described herein relate to an electronic device with self-recovering properties.

Recently, research on a wearable device that is capable of being driven while attached to skin or clothing has been actively conducted. However, although the device is stretchable or bendable, there is a problem in that deterioration of the device occurs due to repeated deformation due to characteristics of a constantly moving body.

Furthermore, in portable devices, damage to the devices by external force occurs very frequently. As these devices are thrown away, economic and environmental problems arise, and thus a need for a solution to economic and environmental problems is emerging.

SUMMARY

Embodiments of the inventive concept provide an electronic device with self-recovering properties which is provided with a self-recovering material to extend a life of the device.

Embodiments of the inventive concept provide an electronic device with self-recovering properties which controls the self-recovering properties of a self-recovering material to be expressed through a specific stimulus to selectively control the self-recovering properties.

Meanwhile, the technical problems to be achieved in the inventive concept are not limited to the technical problems mentioned above and other technical problems that are not mentioned will be clearly understood by those of ordinary skill in the art from the following description.

According to an exemplary embodiment, an electronic device with self-recovering properties includes a substrate including a polymer composite, a conductive pattern disposed on the substrate, and an electrode disposed on the conductive pattern, and the polymer composite includes a composite of different first and second polymers, the first polymer includes a first functional group capable of forming a hydrogen bond between polymer chains, and the second polymer includes a second functional group capable of forming a hydrogen bond between polymer chains.

The substrate may include a first substrate and a second substrate that are physically separated, and when the first and second substrates are in contact with the each other and water ($H_2O$) is applied, the first substrate and the second substrate may be physically coupled.

When the water ($H_2O$) is applied, the substrate may be phase-shifted to a hydrogel state.

The first and second functional groups of the first substrate may respectively form a dynamic hydrogen bond with the first or second functional group of the second substrate.

The first polymer may include any one selected from the group consisting of polyvinyl including polyvinyl alcohol, polyvinyl foam, and polyvinyl acetal, polyester including polycarbonate, polyethylene terephthalate, and polybutylene terephthalate, polyolefin including polyethylene and polypropylene, unsaturated polycarboxylic acid including polyacrylic acid, polymethacrylic acid, and polycrotonic acid, and the second polymer may include cellulose nano-crystal.

The polymer composite may include 5 wt % to 15 wt % of the second polymer.

When the first substrate and the second substrate are physically coupled, the conductive pattern on the first substrate and the conductive pattern on the second substrate may be electrically connected, and the electrode on the first substrate and the electrode on the second substrate may be electrically connected.

The water ($H_2O$) is neutral and has a temperature range of 35° C. to 45° C.

The substrate may have a thickness of 90 μm to 110 μm, the conductive pattern may have a thickness of 15 μm to 25 μm, and the electrode may have a thickness of 60 μm to 80 μm.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
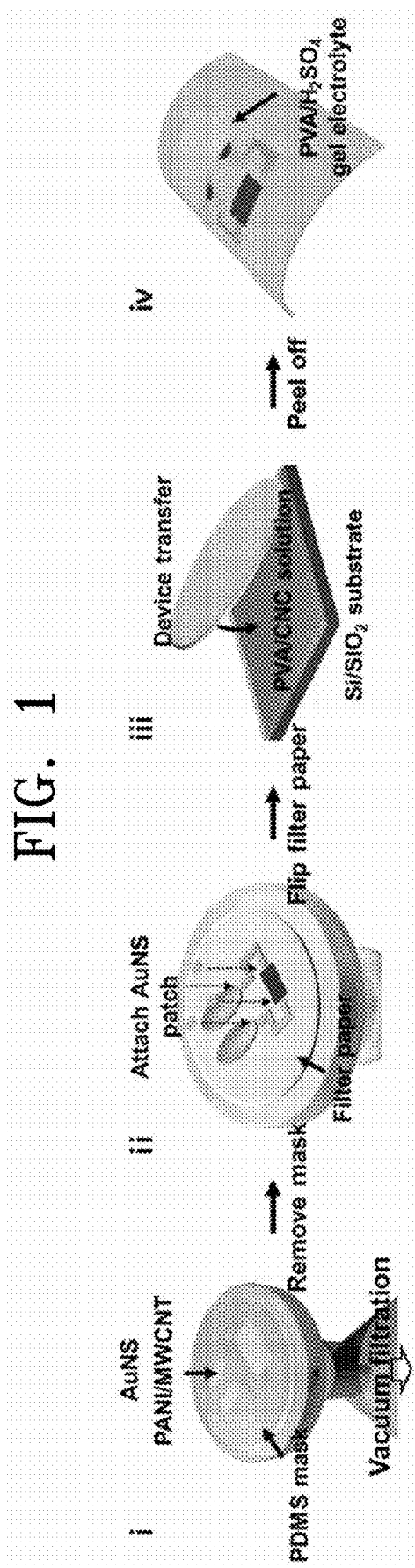
FIG. 1 is an exemplary view schematically illustrating a manufacturing process of an electronic device according to an embodiment of the inventive concept.

Hereinafter, embodiments of the inventive concept will be described in more detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity.

In order to clarify the solution of the present disclosure to the problems, the configuration of the present disclosure is described in detail with reference to the accompanying drawings where the same component is endowed with the same reference symbol at different drawings. Moreover, when a drawing is explained, a component depicted in another drawing may be recited.

In an embodiment of the inventive concept, a self-recovering film (substrate) was produced by preparing a composite in which polyvinyl alcohol (PVA) having self-recovering properties was mixed with cellulose nanocrystals and a polyaniline/carbon nanotube (PANI/MWCNT) composite and gold nanosheet (AuNS) to the film was patterned and transferred through a vacuum filtration process to fabricate an electronic device.

In the inventive concept, a supercapacitor, which is an energy storage device, and a temperature sensor capable of detecting external stimuli were manufactured through the manufacturing method. The manufactured film-type electronic device was driven even after repeated bending, and electrical properties were restored through a self-recovering process after several cuts.

The inventive concept may be produced in a composite of PVA and CNC to secure the self-recovering properties and may be produced in a form of a film with low moisture content. Most of existing self-recovering polymers through hydrogen bond reformation are produced in a form of hydrogels to always active the self-recovering properties. However, the electronic device of the inventive concept is manufactured in a form of a film having the low moisture content. Here, although the electronic device usually does not exhibit the self-recovering properties, a sufficient amount of moisture (water ($H_2O$)) is added thereto to exhibit the self-recovering properties. Therefore, the electronic device may have selective self-recovering properties.

In addition, according to the inventive concept, conductive nanomaterials are patterned using a PDMS mask by a vacuum filtration process and the patterned nanomaterials may be connected to each other and used as an electrode of a two-dimensional electronic device.

In addition, according to the inventive concept, the electronic device may be manufactured using the above two methods to ensure mechanical stability and self-recovering properties.

Hereinafter, a manufacturing process of an electronic device according to an embodiment of the inventive concept will be described with reference to FIG. 1.

FIG. 1 is an exemplary view schematically illustrating a manufacturing process of an electronic device according to an embodiment of the inventive concept.

First, referring to FIG. 1, cellulose nanocrystals (CNC) are synthesized, a PVA/CNC composite is prepared, a polyaniline/carbon nanotube (PANI/MWCNT) composite is synthesized, and gold nanosheets (AuNS) are synthesized, and then a self-recovering electronic device is patterned and manufactured. Therefore, the electronic device according to an embodiment of the inventive concept is manufactured.

This will be described in detail as follows.

Synthesis of Cellulose Nanocrystals Through Sulfuric Acid Hydrolysis 4 g of microfibril cellulose powder and 70 ml of 60% sulfuric acid are put together and mixed well, and then hydrolysis is performed for 45 minutes at 45 degrees.

When a cloudy yellow liquid is formed after 45 minutes, the liquid is diluted with DI water, and then an acid therein is removed by a vacuum filtration method using a cellulose ester filter paper.

Thereafter, after repeating the vacuum filtration 3 times, the liquid is neutralized by the osmotic filtration method to approach pH 7. Subsequently, the produced CNC dispersion allows CNC to separate well from each other through ultrasonication. After all the processes are completed, CNC separated through vacuum filtration is dispersed in DI water to produce a 5 w/v % CNC dispersion.

PVA/CNC Composite Fabrication 2 ml of the prepared CNC dispersion and 1 g of polyvinyl alcohol (PVA) powder, 8 ml of DI water are mixed with one another and heated with vigorous stirring at about 120 degrees for 2 hours to prepare a PVA/CNC composite solution.

1 ml of the above prepared PVA/CNC solution is applied to a Si/SiO2 substrate having 3×3 $cm^2$ and is exposed to air for about 12 hours to prepare the PVA/CNC composite in a form of a film. The produced film may have a thickness of about 100 μm.

Here, the PVA/CNC composite film may be applied to a substrate of an electronic device, and thus the film and the substrate may be interchangeably used below.

Gold Nano Sheet (AuNS) Synthesis

A gold nanosheet was produced through reduction using L-arginine. 10 ml of 0.78 mM L-arginine and 4 ml of 17 mM HAuCl4.H2O were injected into a vial, mixed with each other, and heated at 95 degrees for 24 hours.

AuNS was formed at a bottom of the vial, and a solvent and AuNS were separated using a micropipette, and then AuNS was dispersed in 5 ml of ethanol to be used.

Patterning and Fabrication of Self-Recovering Electronic Device

The self-recovering electronic device was manufactured through a vacuum filtration method using a PDMS patterning mask. 3 g of PDMS (Slygard 184) in which a base and a curing agent were mixed at a mass ratio of 15:1 was poured into a petri dish having a diameter of 50 mm and cured and separated in a 65 degree oven for 20 minutes.

The pattern of the electronic device was formed by cutting in advance to have a desired shape, and the PDMS mask produced by the above method was attached on a PTFE-T (pore size 0.2 μm, Hyundai Micro) filter paper.

Here, a type of filter paper may be adjusted depending on a type of the solvent of the dispersion and a pore size of the filter paper may be adjusted depending on a size of a nanomaterial.

For example, the type and pore size of the filter paper may be set to [Cellulose ester, hydrophilic PTFE filter paper], [pore size 0.1 μm, 0.2 μm] or the like.

The device was patterned through a vacuum filtration method, and 2 ml of PANI/MWCNT dispersion and 0.5 ml of AuNS dispersion were sequentially applied to each electrode of the supercapacitor. The temperature sensor was prepared by applying 0.5 ml of PANI/MWCNT solution. After the electrode patterning is completed, the mask is removed, the AuNS patch (pre-made by vacuum filtration of AuNS) is attached to each electrode and the connection line while the vacuum pump is turned on to be electrically connected. The device, which is patterned, is transferred by flipping the filter paper on a top of the PVA/CNC solution applied to Si/SiO2. After curing is over about 12 hours, the filter paper is peeled off and removed, thereby manufacturing the electronic device according to an embodiment of the inventive concept.

Through the manufacturing process, an electronic device illustrated in FIGS. 2 to 5 may be manufactured.

Hereinafter, an electronic device according to an exemplary embodiment of the inventive concept will be described with reference to FIGS. 2 to 9.

Figure 2:
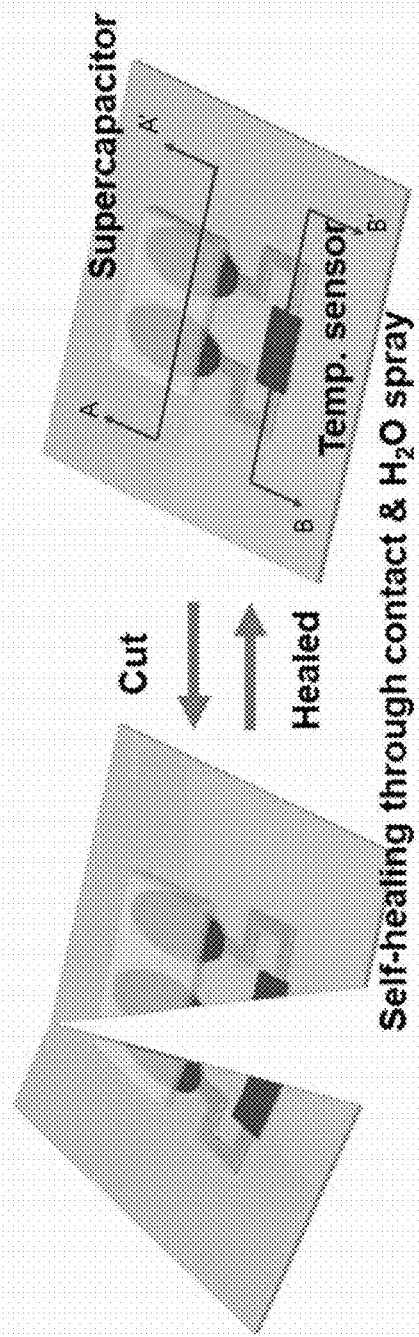
FIG. 2 is an exemplary view schematically illustrating an electronic device and a self-recovering process according to an embodiment of the inventive concept.
Figure 3:
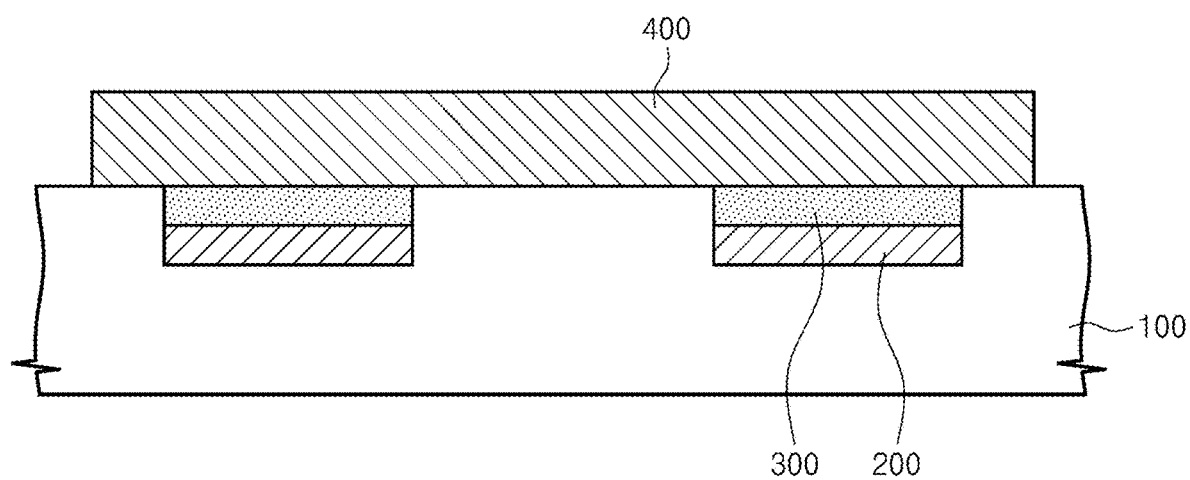
FIG. 3 is a cross-sectional view taken along a line A-A' of FIG. 2.
Figure 4:
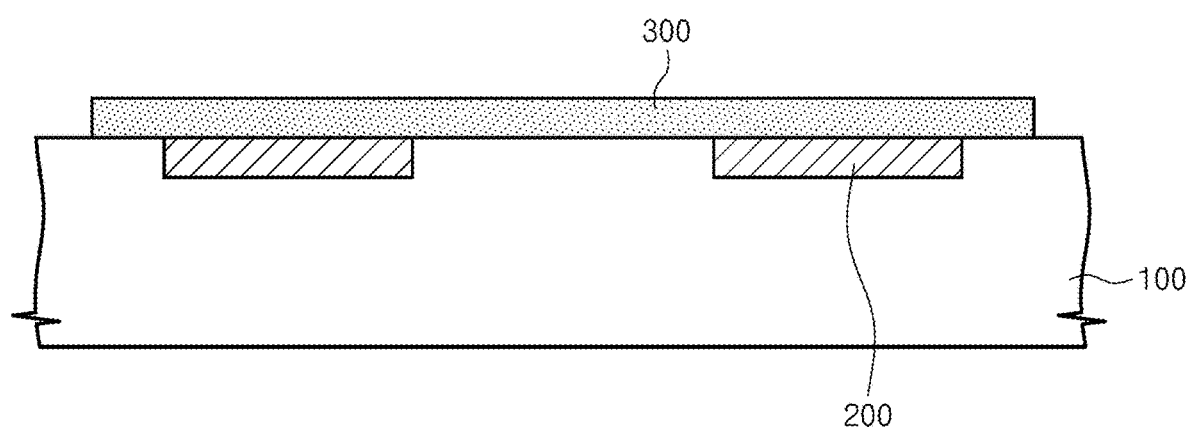
FIG. 4 is a cross-sectional view taken along a line B-B' of FIG. 2.
Figure 5:
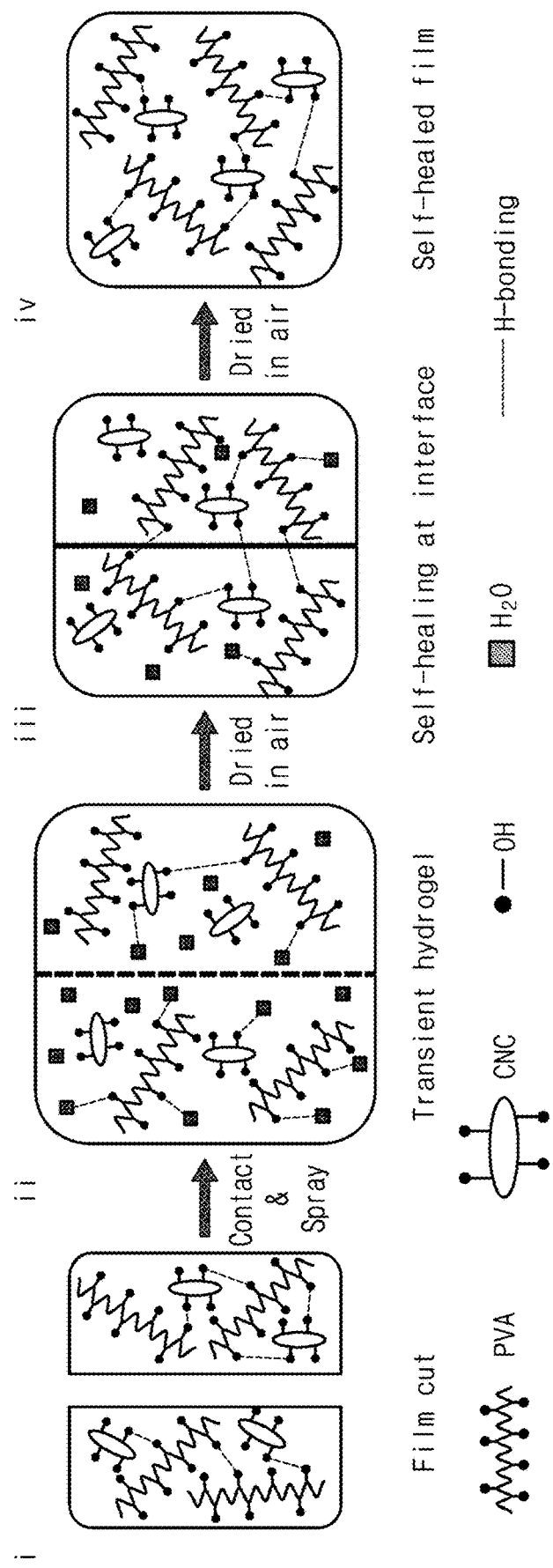
FIG. 5 is an exemplary view illustrating a self-recovering process of a substrate when water ($H_2O$) is applied in an embodiment of the inventive concept.
Figure 6:
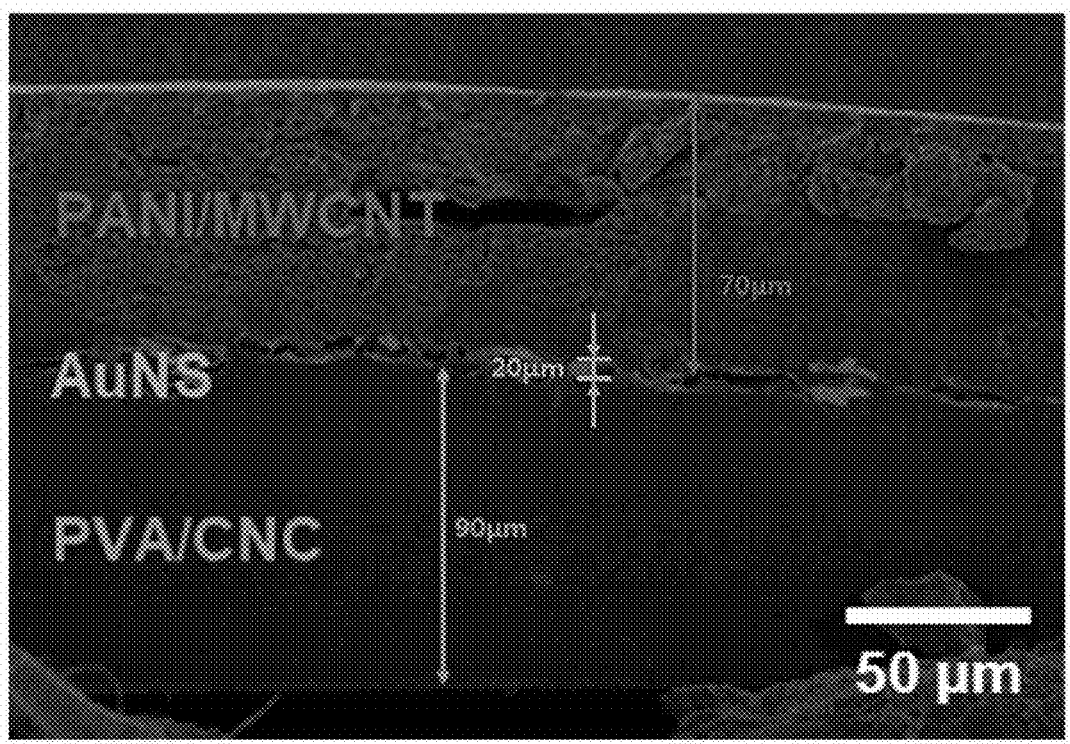
FIG. 6 is an SEM image illustrating a cross-section of FIG. 3.
Figure 7:
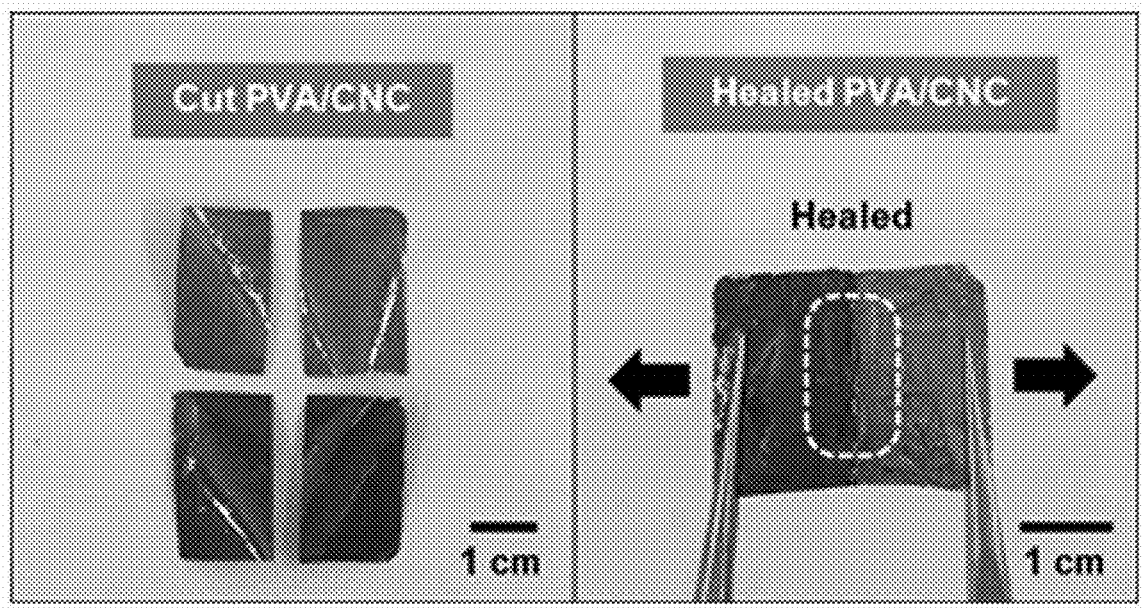
FIG. 7 is an image illustrating self-recovering properties of a substrate dyed in a different color in the embodiment of the inventive concept.
Figure 8A:
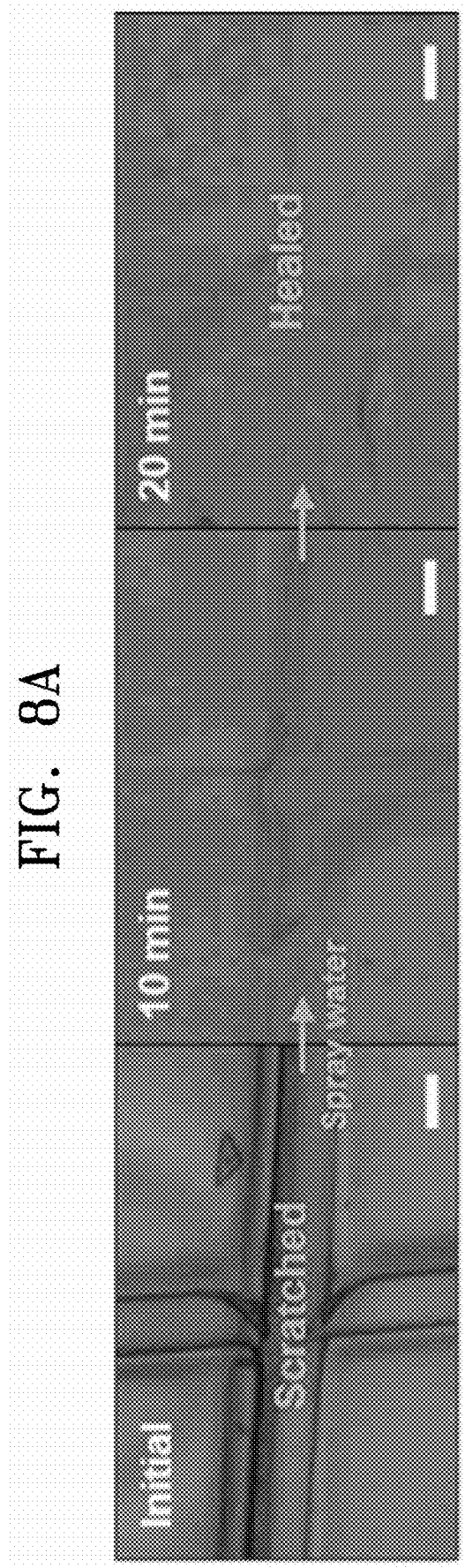
FIG. 8A is an optical image illustrating self-recovering properties of a substrate for a surface scratch formed in a '+' type at 10-minute intervals in an embodiment of the inventive concept.
Figure 8B:
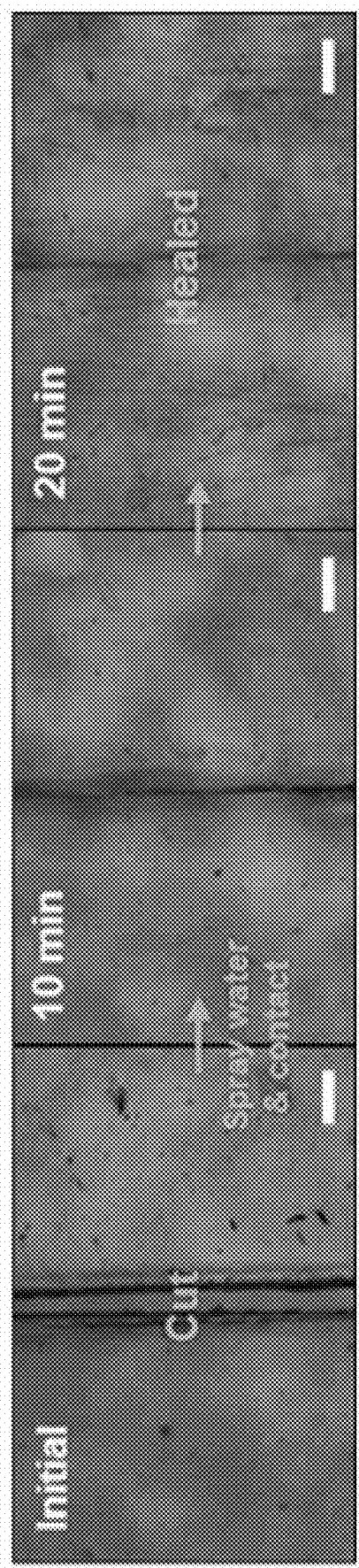
FIG. 8B is an optical image illustrating self-recovering properties of a substrate cut in a '-' form at 10-minute intervals in an embodiment of the inventive concept.
Figure 9A:
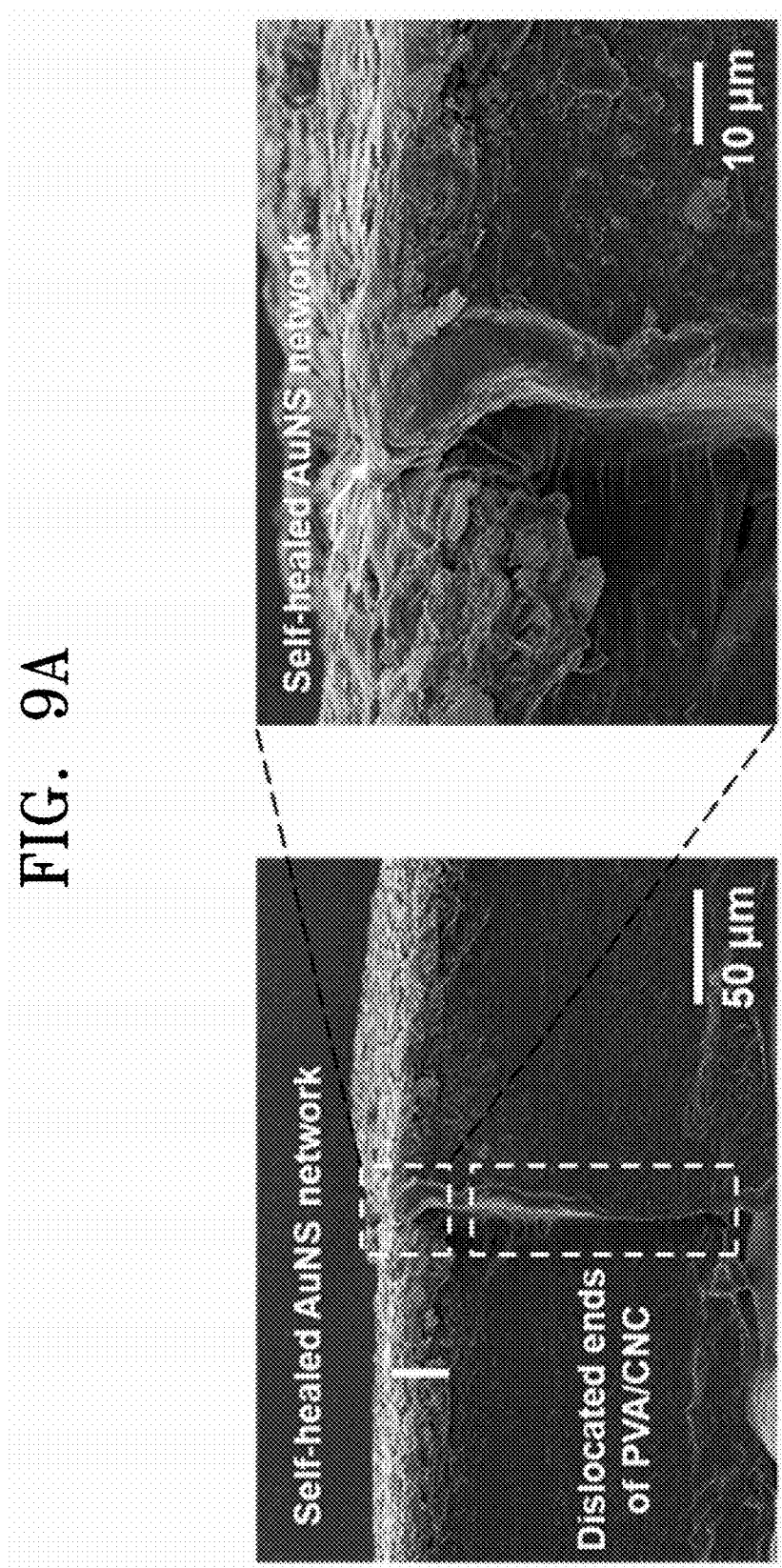
FIG. 9A is a cross-SEM image after cutting and self-recovering of an electrode fixed with a gold nanosheet.
Figure 9B:
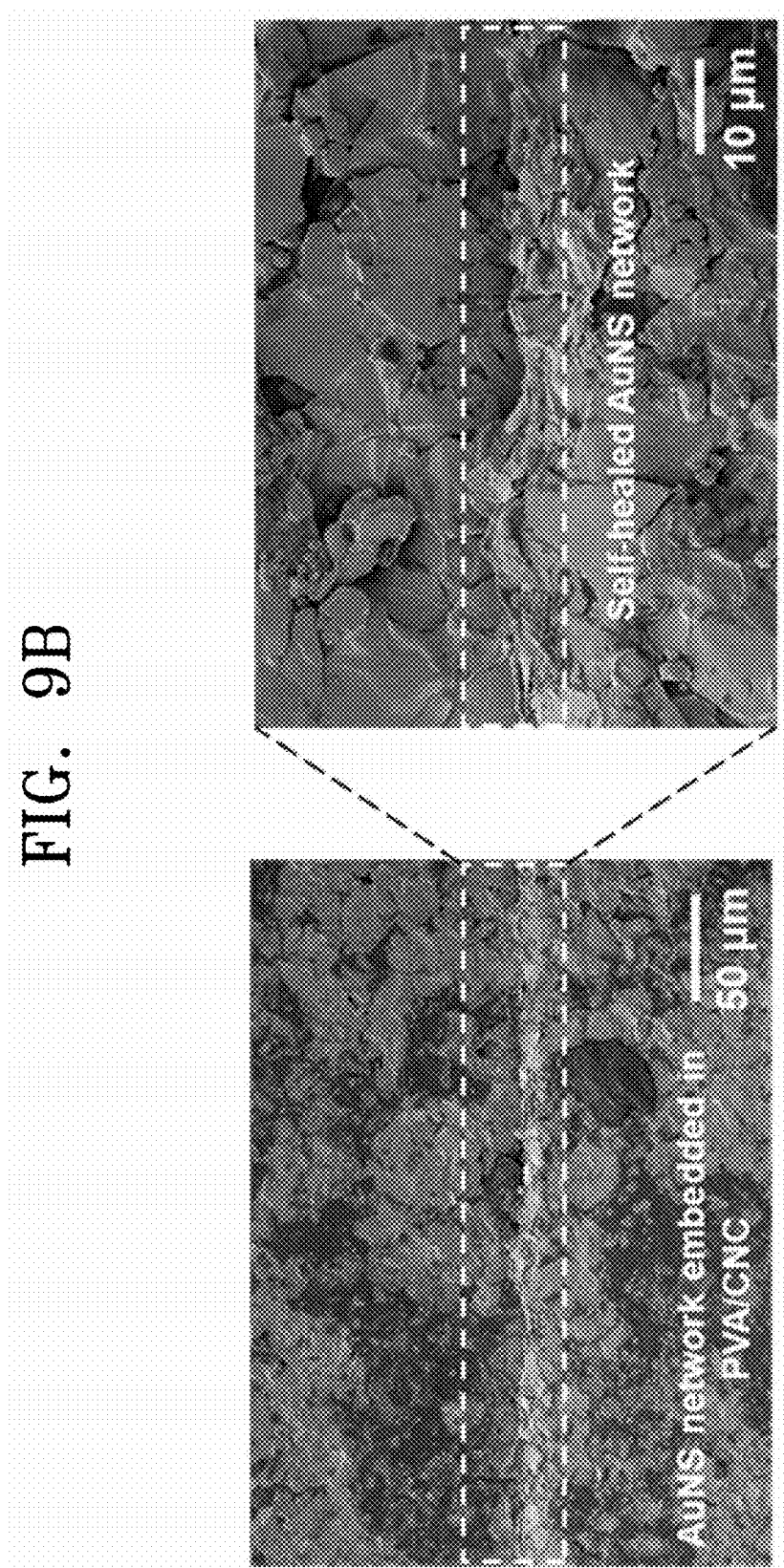
FIG. 9B is a front SEM image after cutting and self-recovering of an electrode fixed with a gold nanosheet.

FIG. 2 is an exemplary view schematically illustrating an electronic device and a self-recovering process according to an embodiment of the inventive concept, FIG. 3 is a cross-sectional view taken along a line A-A' of FIG. 2, FIG. 4 is a cross-sectional view taken along a line B-B' of FIG. 2, FIG. 5 is an exemplary view illustrating a self-recovering process of a substrate when water ($H_2O$) is applied in an embodiment of the inventive concept, FIG. 6 is an SEM image illustrating a cross-sectional view of FIG. 3, FIG. 7 is an image illustrating self-recovering properties of a substrate dyed in a different color in the embodiment of the inventive concept, FIG. 8A is an optical image illustrating self-recovering properties of a substrate for a surface scratch formed in a '+' type at 10-minute intervals in an embodiment of the inventive concept, FIG. 8B is an optical image illustrating self-recovering properties of a substrate cut in a '-' form at 10-minute intervals in an embodiment of the inventive concept, FIG. 9A is a cross-SEM image after cutting and self-recovering of an electrode fixed with a gold nanosheet, and FIG. 9B is a front SEM image.

In an embodiment, a supercapacitor and a temperature sensor may be implemented on one substrate 100 together.

First, referring to FIGS. 2 to 4, an electronic device including a supercapacitor and a temperature sensor may include the substrate 100, a conductive pattern 200 disposed on the substrate 100, and a pair of electrodes 300 disposed on the conductive pattern 200.

In addition, when the electronic device is a supercapacitor, an electrolyte 400, which is disposed on the pair of electrodes 300 and connects the electrodes 300 therebetween may be further provided.

Meanwhile, the substrate 100 may be composed of a polymer composite, and may include composites of different first and second polymers.

Here, the first polymer may include a first functional group capable of forming hydrogen bonds between polymer chains and the second polymer may include a second functional group capable of forming hydrogen bonds between polymer chains.

That is, one first polymer may form a hydrogen bond with a neighboring second polymer or another first polymer through the functional group.

As an example, the first polymer may include any one selected from the group consisting of polyvinyl including polyvinyl alcohol, polyvinyl foam, and polyvinyl acetal, polyester including polycarbonate, polyethylene terephthalate, and polybutylene terephthalate, polyolefin including polyethylene and polypropylene, unsaturated polycarboxylic acid including polyacrylic acid, polymethacrylic acid, and polycrotonic acid, and polyacrylamide. The second polymer may include cellulose nano-crystal.

Meanwhile, referring to FIG. 5, the substrate 100 may be phase-shifted to a hydrogel state when water ($H_2O$) is applied and a dynamic hydrogen bond may be formed between the functional groups included in the first polymer and the second polymer of the adjacent substrate 100 or the cut substrate 100 in the hydrogel state to have the self-recovering properties.

That is, the substrate 100 may be not express the self-recovering properties even when cut in a dried state, but may be transferred into a temporary hydrogel form as water ($H_2O$) is applied, to express the self-recovering properties.

The conductive pattern 200 may be disposed on the substrate 100 and serve as an electrical wiring.

As described above, the conductive pattern 200 may be disposed on the substrate 100 through a vacuum filtration process, but not limited thereto.

The conductive pattern 200 may be composed of a conductive sheet and may be one conductive metal selected from the group consisting of silver (Ag), gold (Au), cobalt (Co), nickel (Ni), copper (Cu), palladium (Pd), platinum (Pt), tin (Sn), zirconium oxide, tin oxide, antimony oxide, nickel oxide, aluminum oxide, indium tin oxide (ITO), and combinations thereof.

The electrodes 300 may be disposed on the conductive pattern 200 and include polyaniline/carbon nanotube (PANI/MWCNT) composite.

Meanwhile, the electrodes 300 may be changed in a type of nano-material for drop-casting depending on characteristics of the electronic device and may include metal oxides nanostructure such as carbon nanotube (CNT), silver nanowire (AgNW), $TiO_2$ $MoO_3$ nanorod, or the like.

Meanwhile, the electrolyte 400 may include an organic electrolyte material, and examples of the organic electrolyte may include alkyl salts and acetonitrile (ACN) organic solvents.

For example, the alkyl salt may include tetraethylammonium, tetrabutylammonium, or tetramethylammonium as a cation. In particular, examples of the alkyl salt include tetraethylammonium tetrafluoroborate ($TEABF_4$).

As illustrated in FIG. 6, in the electrode device, a thickness of the substrate may be 90 μm to 110 μm, a thickness of the conductive pattern may be 15 μm to 25 μm, and a thickness of the electrode may be 60 μm to 80 μm.

That is, it may be confirmed that a thickness of one thin-film electronic device having the substrate, the conductive pattern, and the electrode may be implemented within 200 μm or within 220 μm.

Meanwhile, referring to FIG. 7, a first substrate and a second substrate, which are composed of the same polymer composite (PVA/CNC), are dyed in different colors and self-recovering properties of the first substrate and the second substrate may be confirmed.

In detail, as illustrated in FIG. 8, after scratching a surface of the polymer composite (PVA/CNC) substrate, water ($H_2O$) is applied and measured at 10-minute intervals, and it may be confirmed that a damage area formed on the surface of the substrate is restored to its original state through self-recovering.

In addition, as illustrated in FIGS. 8 and 9, after one substrate is cut into the first substrate and the second substrate and the first and second substrates are in contact with each other, water ($H_2O$) is applied and measured at 10-minute intervals, and thus it may be confirmed that mechanical bonding is achieved through self-recovering at a boundary between the first and second substrates.

In addition, referring to FIG. 9, it may be seen that the separated polymer composite (PVA/CNC) substrate is mechanically coupled, and the conductive pattern on the substrate is also mechanically coupled to be electrically connected.

Here, the conductive pattern and the electrode are not physically bonded, but the conductive pattern and the electrode are re-formed in a percolation network (state in which conductive materials are entangled with each other like a spider web to establish an electrical connection) in the self-recovering process of the substrate.

After the damaged electrodes are in contact with each other, the applied water ($H_2O$) permeates between the separated conductive pattern and the network of the electrodes and is contact with the substrate. Accordingly, the physical coupling of the separated electronic device may proceed by self-recovering of the substrate.

Through this, the electronic device according to an embodiment of the inventive concept may be implemented with a thickness of about 200 µm. In addition, when an external shock is transmitted to the electronic device and is damaged, water ($H_2O$) is applied, and then the electronic device exhibits the self-recovering properties capable of bonding the damaged substrate through dynamic hydrogen bonding between the polymers of the substrate to be mechanically and electrically restored.

Figure 10A:
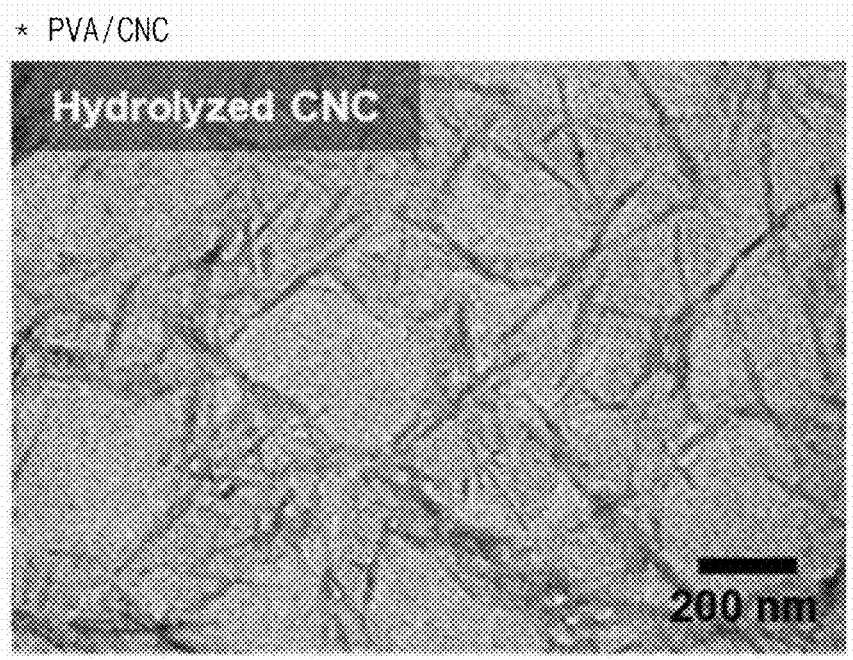
FIG. 10A is a TEM image of CNC used in an embodiment of the inventive concept.
Figure 10B:
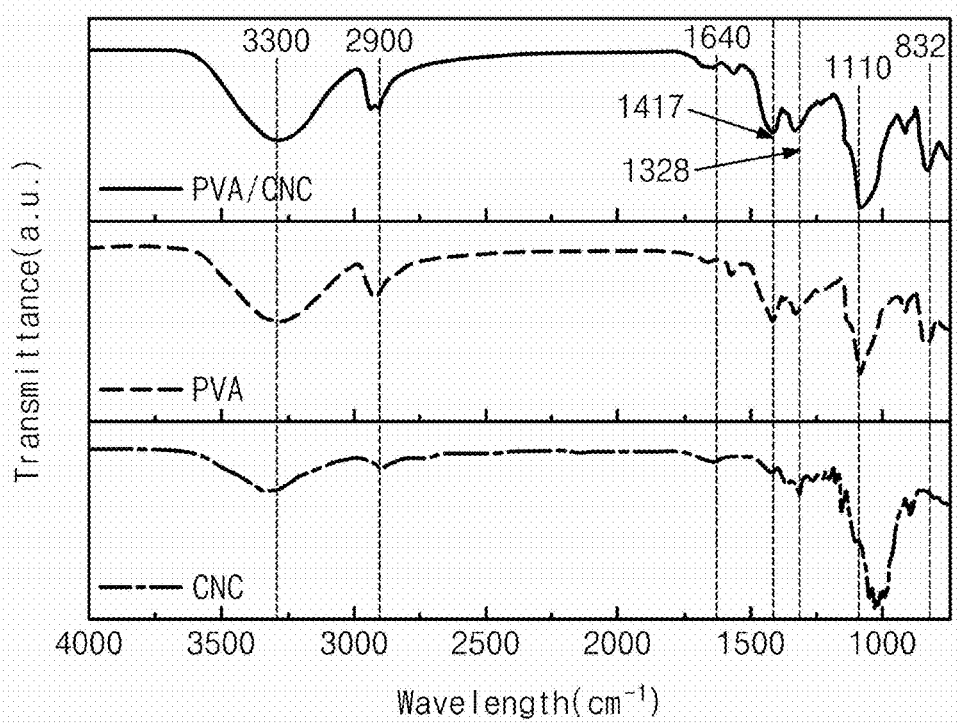
FIG. 10B is a result graph of FT-IR spectroscopy analysis of PVA/CNC composite used in an embodiment of the inventive concept.
Figure 10C:
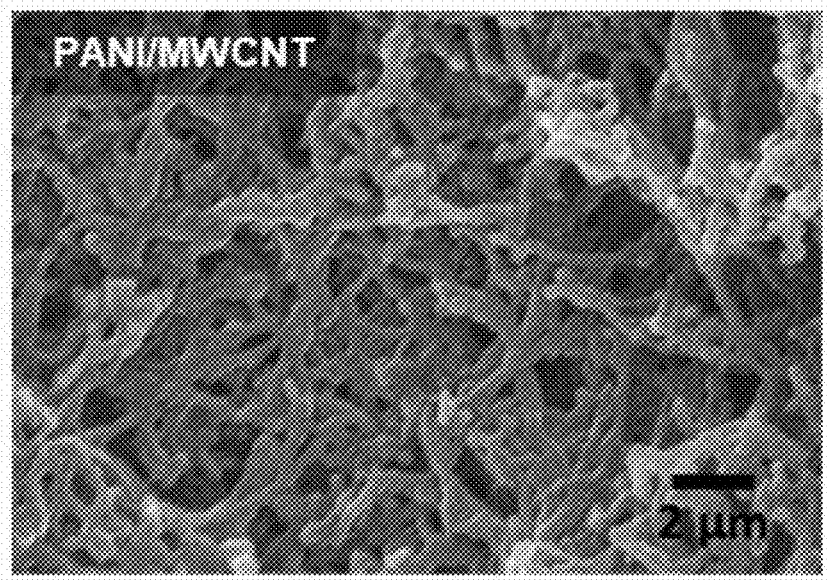
FIG. 10C is an SEM image of PANI/MWCNT composite used in an embodiment of the inventive concept.
Figure 10D:
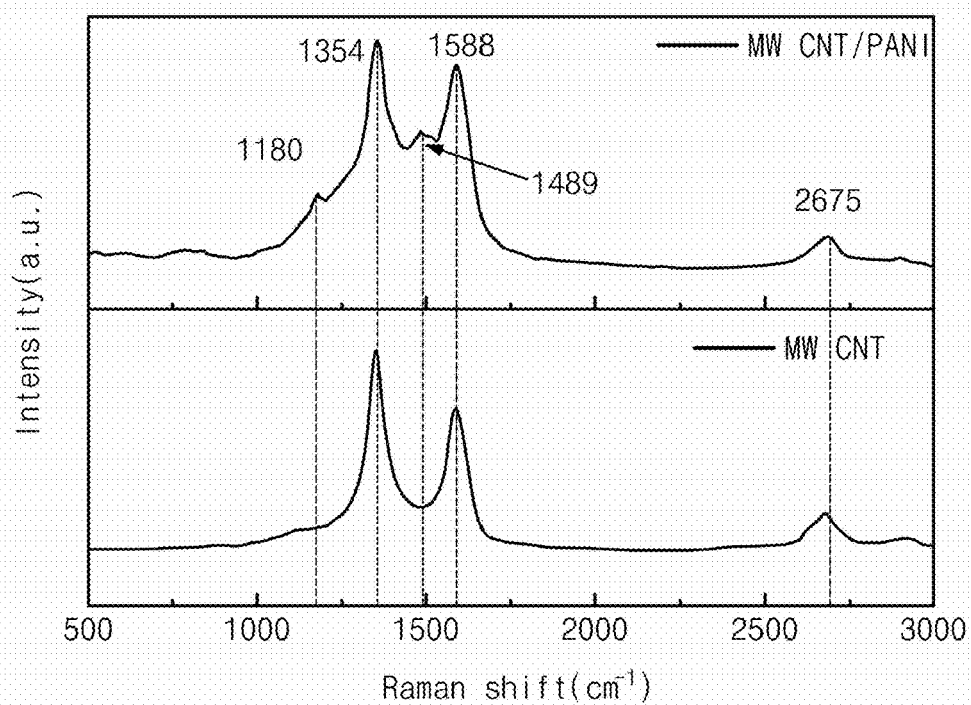
FIG. 10D is a result graph of a Raman spectroscopy analysis of PANI/MWCNT composite used in an embodiment of the inventive concept.
Figure 10E:
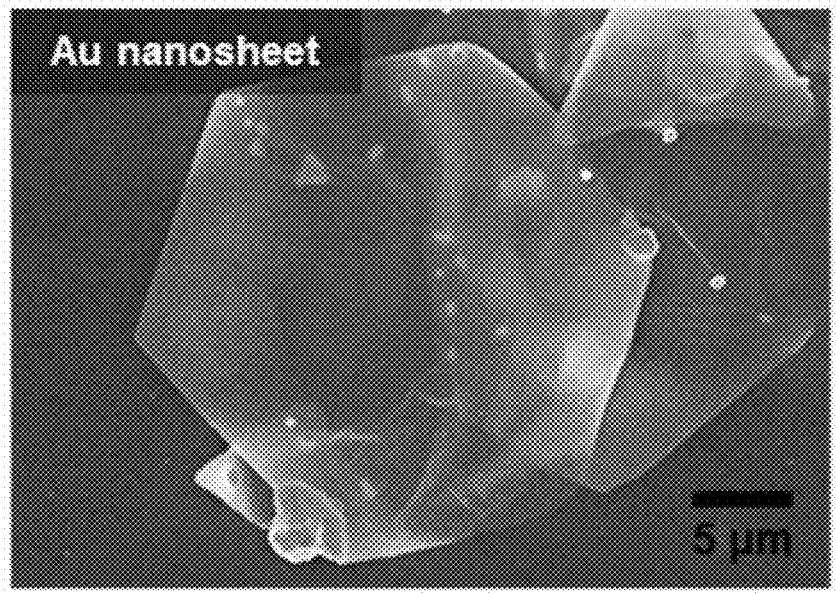
FIG. 10E is an SEM image of AuNS used in an embodiment of the inventive concept.
Figure 10F:
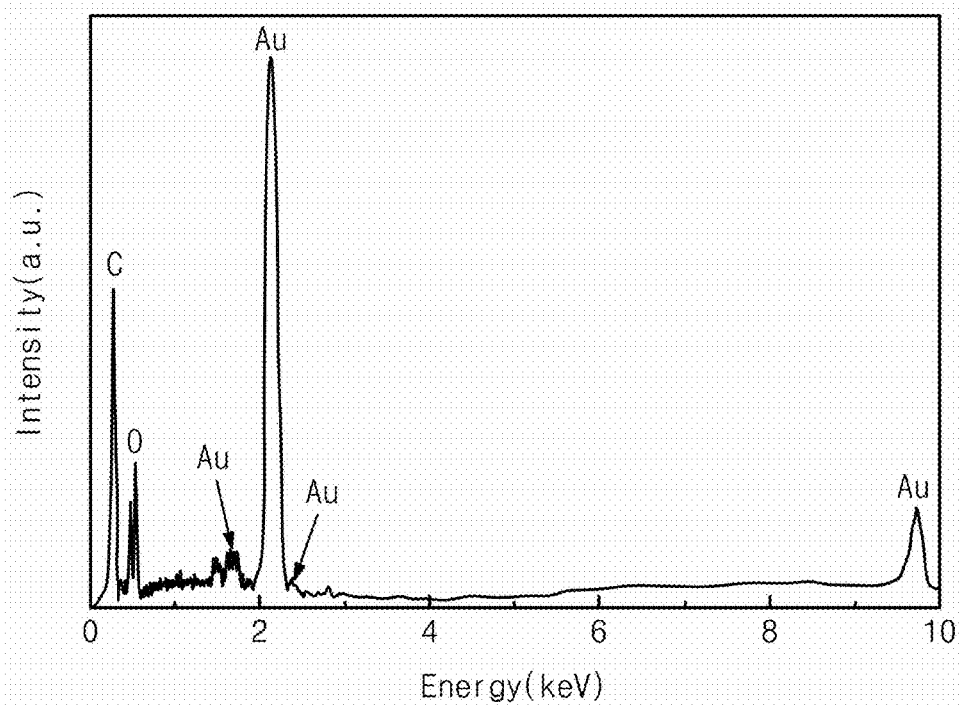
FIG. 10F is an EDX analysis result of AuNS used in an embodiment of the inventive concept.

FIGS. 10A, 10B, 10C, 10D, 10E, and 10F are a diagram illustrating a material of an electronic device according to an embodiment of the inventive concept. FIG. 10A is a TEM image of a CNC used in an embodiment of the inventive concept and FIG. 10B is a result graph of FT-IR spectroscopy analysis of PVA/CNC composite. FIG. 10C is an SEM image of PANI/MWCNT composite used in an embodiment of the inventive concept and FIG. 10D is a result graph of a Raman spectroscopy analysis of PANI/MWCNT composite. FIG. 10E is an SEM image of synthesized AuNS and FIG. 10F is an EDX analysis result of AuNS.

Referring to FIGS. 10A, 10B, 10C, 10D, 10E, and 10F, it may be confirmed that PVA/CNC composite which is a self-recovering material, PANI/MWCNT which is an electrode material, and AuNS which is a current collector are synthesized.

Hereinafter, characteristics of an electronic device according to an embodiment of the inventive concept will be described with reference to FIGS. 11 to 18.

Figure 11A:
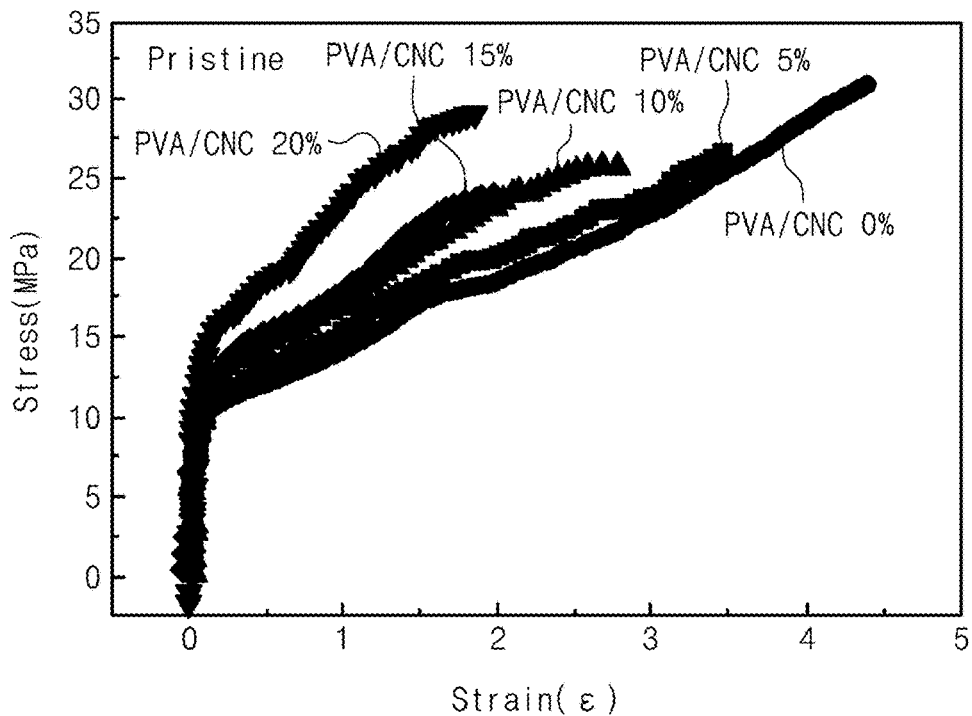
FIG. 11A is a result graph of a strain-stress curve of PVA/CNC composite depending on a mass percentage of CNC for PVA.
Figure 11B:
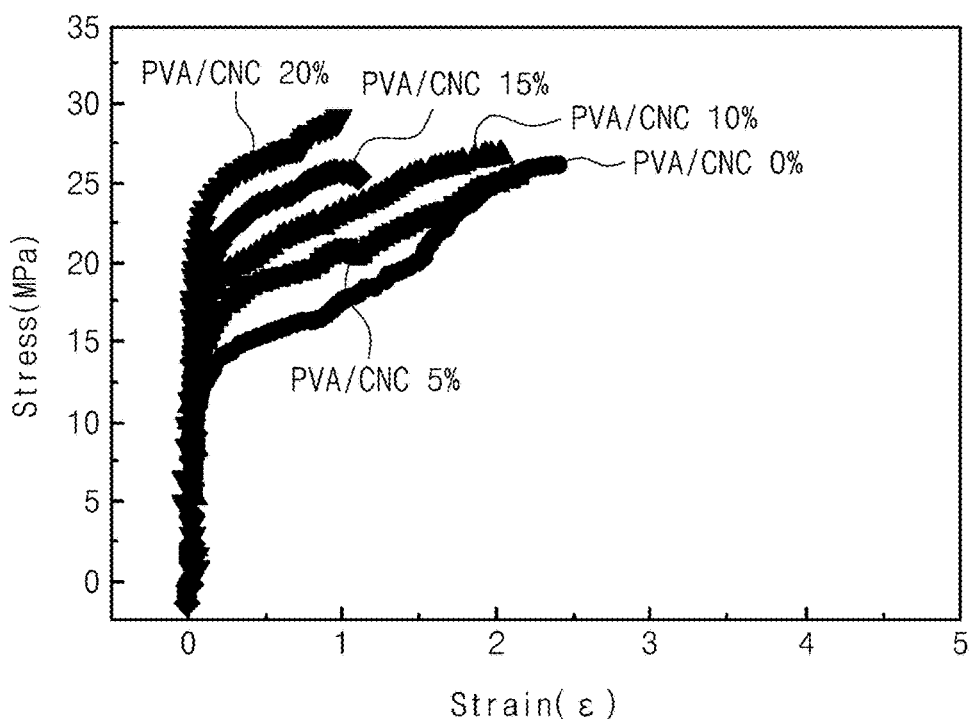
FIG. 11B is a result graph of a strain-stress curve after self-recovering of PVA/CNC composite depending on a mass percentage of CNC for PVA.
Figure 11C:
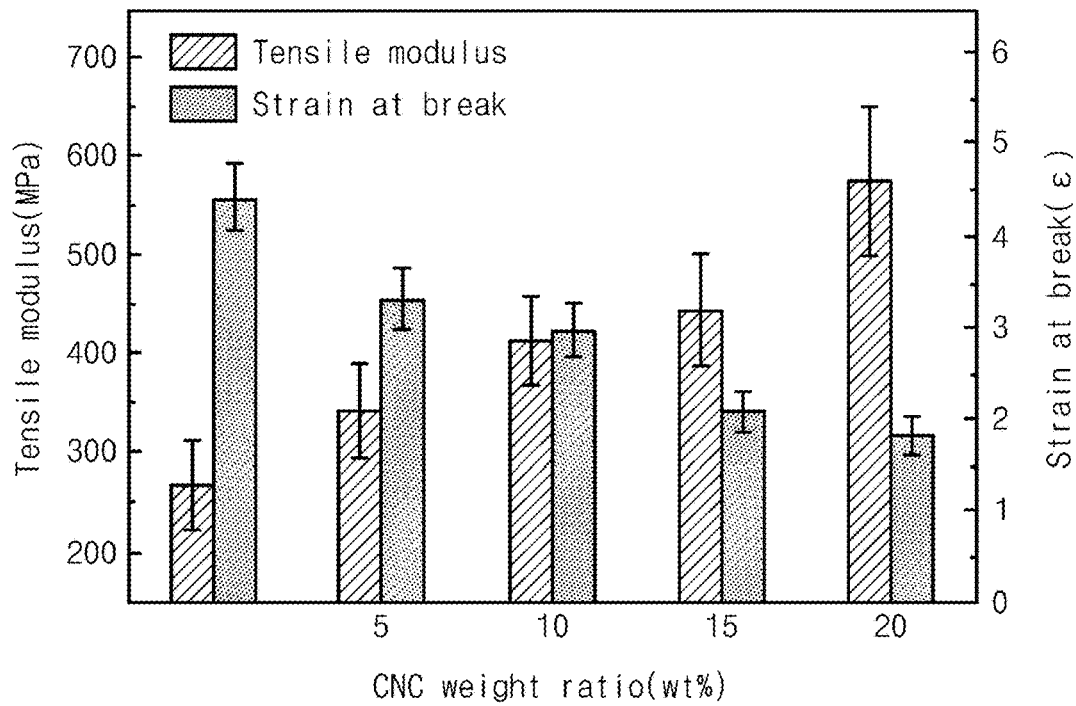
FIG. 11C is a graph of tensile modulus and strain at break of PVA/CNC composite depending on a mass percentage of CNC for PVA.
Figure 11D:
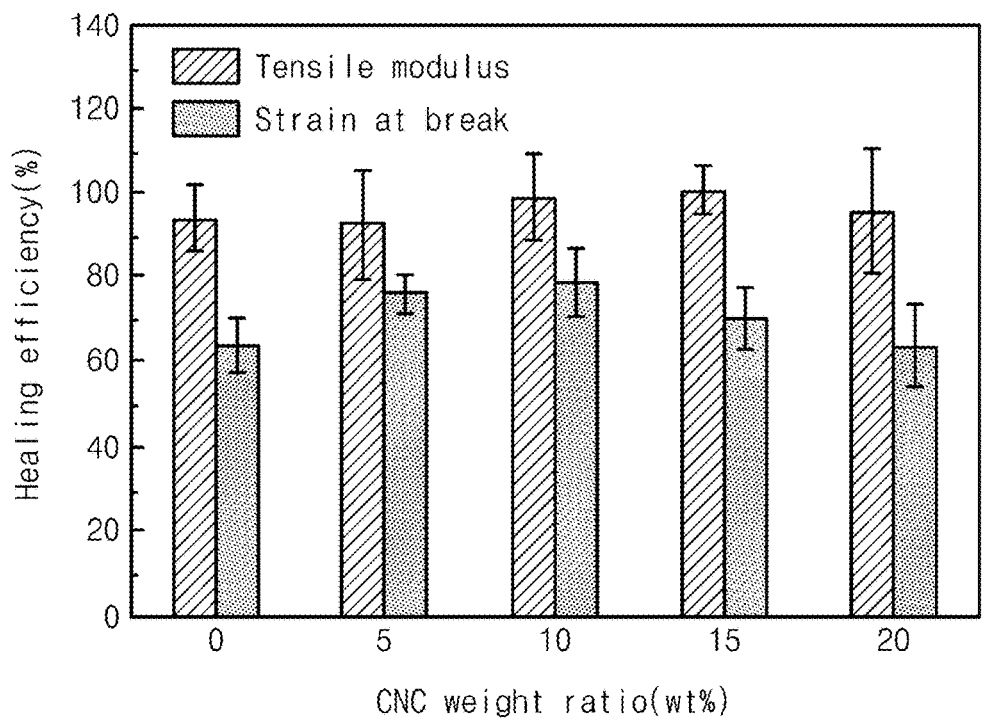
FIG. 11D is a graph of recovery rate of tensile modulus and strain at break after self-recovering of PVA/CNC composite depending on a mass percentage of CNC for PVA.
Figure 11E:
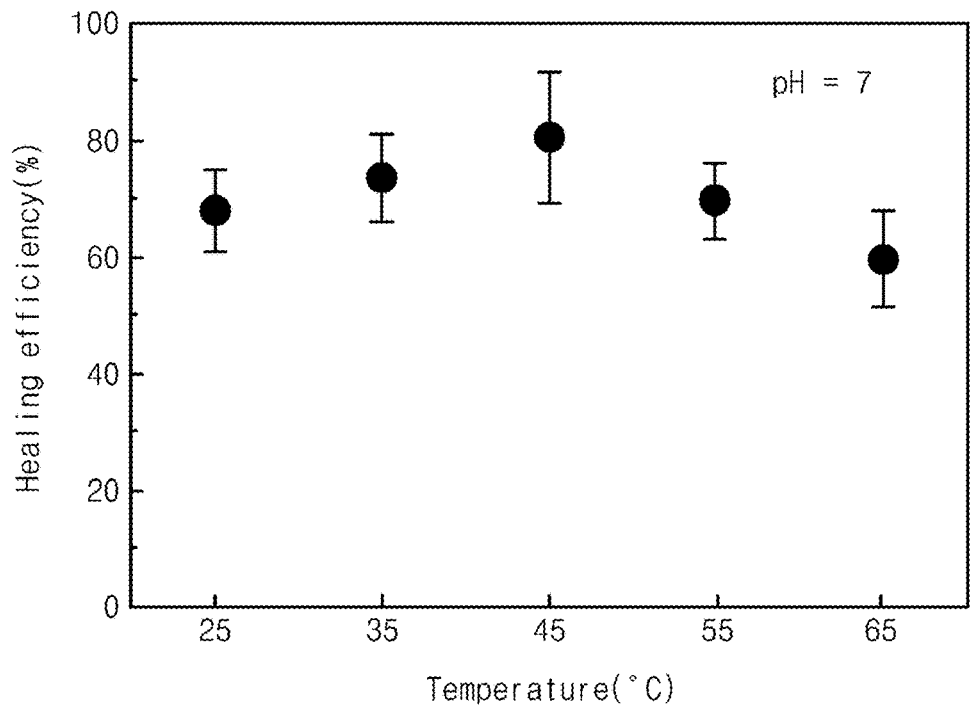
FIG. 11E is self-recovering efficiency of PVA/CNC (10 wt %) composite depending on a self-recovering temperature (based on strain at break)
Figure 11F:
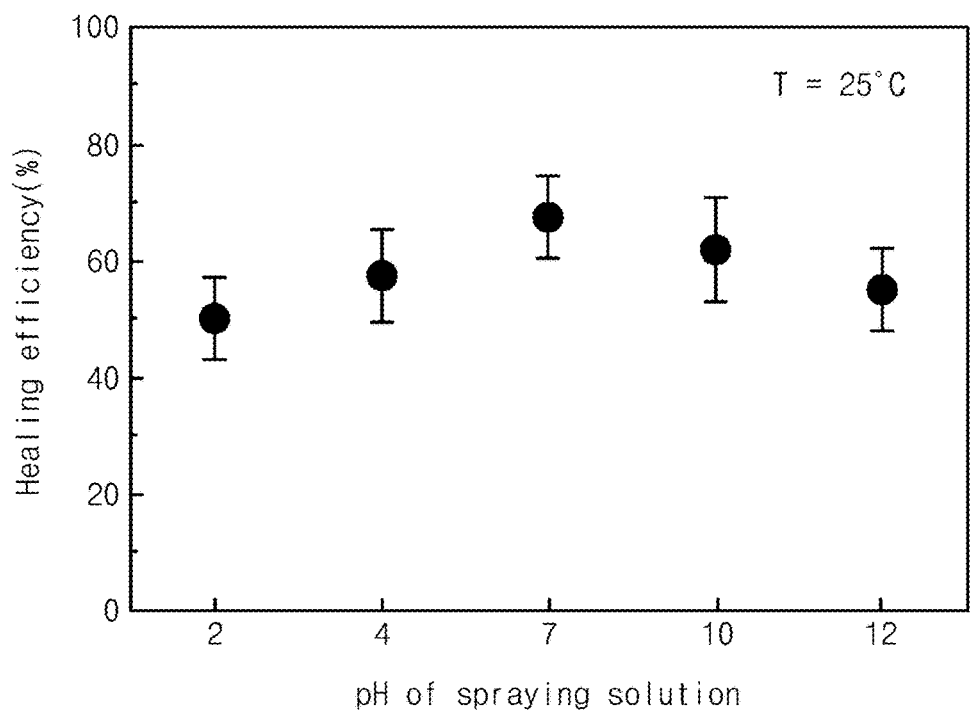
FIG. 11F is self-recovering efficiency of PVA/CNC (10 wt %) composite depending on a pH of a self-recovering solution (based on strain at break)

FIG. 11A is a result graph of a strain-stress curve of PVA/CNC composite depending on a mass percentage of CNC for PVA and FIG. 11B is a result graph of a strain-stress curve after self-recovering of PVA/CNC composite depending on a mass percentage of CNC for PVA. FIG. 11C is a graph of tensile modulus and strain at break of PVA/CNC composite depending on a mass percentage of CNC for PVA and FIG. 11D is a graph of recovery rate of tensile modulus and strain at break after self-recovering of PVA/CNC composite depending on a mass percentage of CNC for PVA. FIG. 11E is self-recovering efficiency of PVA/CNC (10 wt %) composite depending on a self-recovering temperature (based on strain at break) and FIG. 11F is self-recovering efficiency of PVA/CNC (10 wt %) composite depending on a pH of a self-recovering solution (based on strain at break).

Referring to FIGS. 11A, 11B, 11C, and 11D, it may be confirmed that the mechanical properties are adjusted depending on the mass ratio of the PVA/CNC composite through the strain-stress curve measurement and the self-recovering properties is exhibited. The mechanical properties are that the tensile modulus and strain at break are changed, and it may be confirmed that the mechanical characteristics of the PVA/CNC composite are adjusted depending on addition of CNC. In addition, it may be confirmed that the mechanical self-recovering properties exhibited through the strain-stress graph after self-recovering, the self-recovering properties change depending on the proper addition of CNC, and high self-recovering efficiency is exhibited when the mass ratio of CNC is 5% to 15. In addition, it may be seen that the highest self-recovering efficiency (67.4%) is exhibited when the mass ratio of CNC of the substrate is 10%.

In addition, referring to FIG. 11E, it may be confirmed that the self-recovering efficiency changes depending on the temperature of the solution applied upon self-recovering of the substrate and the high self-recovering efficiency is exhibited when the solution is at 35 degrees to 45 degrees.

In addition, it may be confirmed that the highest self-recovering efficiency (79.9%) is exhibited when the temperature of the solution is 45 degrees.

In addition, referring to FIG. 11F, it may be confirmed that the self-recovering efficiency varies depending on the pH of the solution applied upon self-recovering of the substrate and the high self-recovering efficiency is exhibited when the solution is at pH 4 to pH 7. It may be confirmed that the highest self-recovering efficiency is exhibited when the pH of the solution is neutral (pH 7).

Figure 12A:
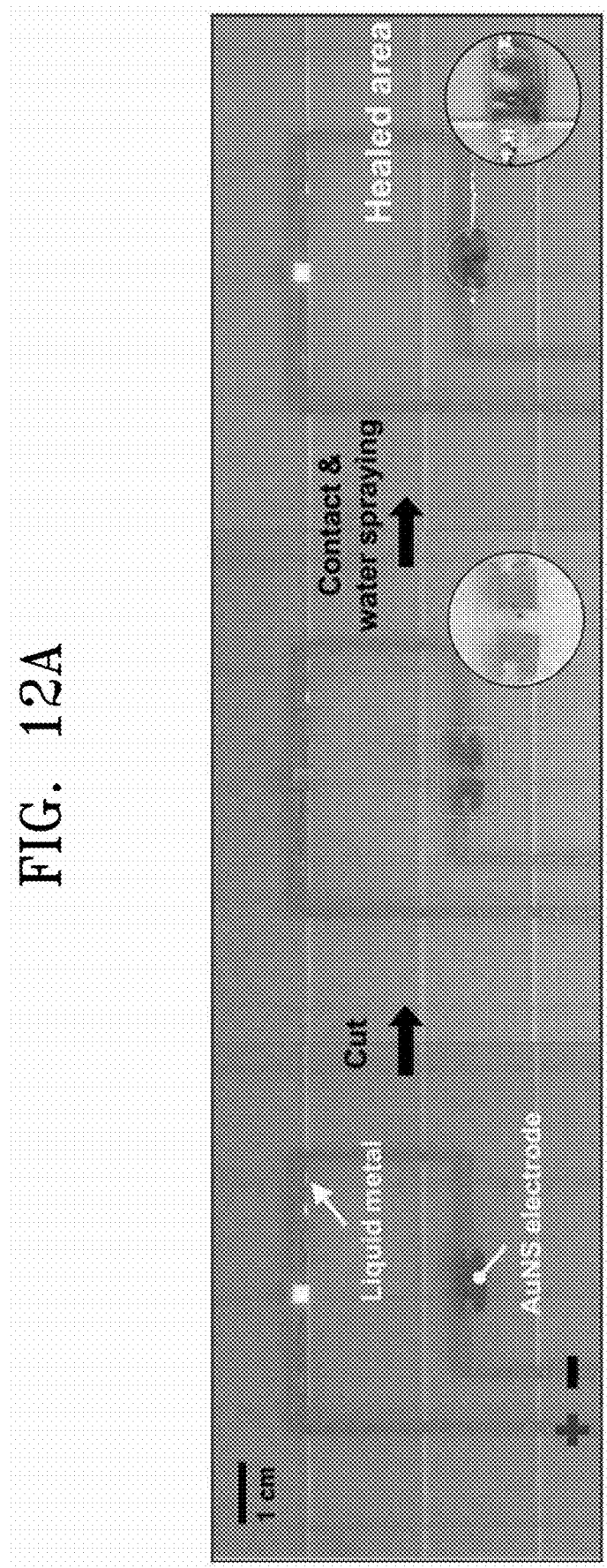
FIG. 12A is an optical photo illustrating electrical self-recovering properties of an electrode fixed with AuNS.
Figure 12B:
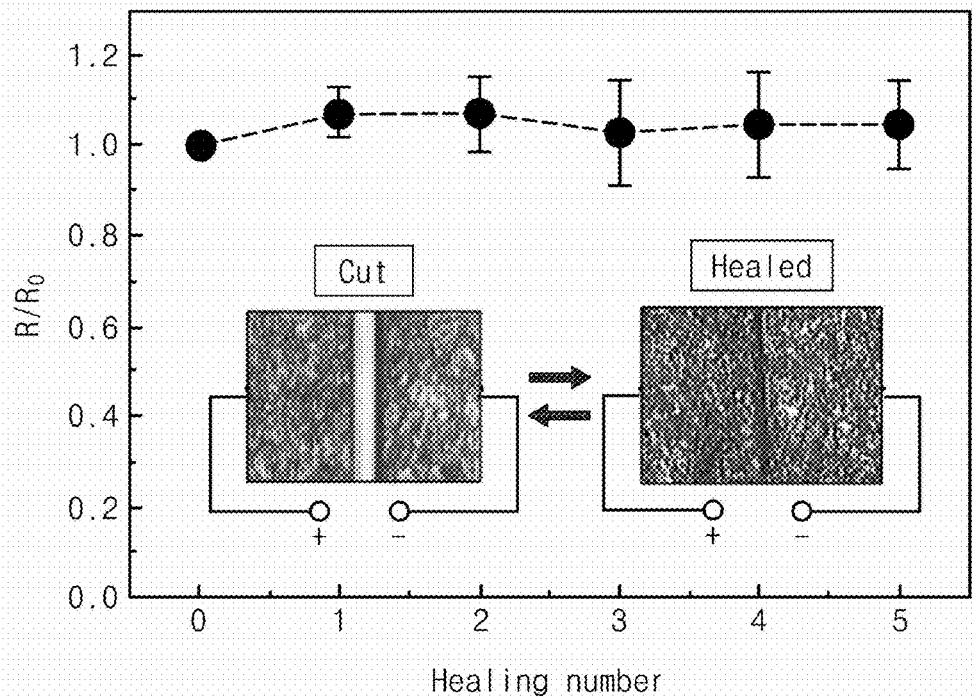
FIG. 12B is a graph illustrating a resistance change with regard to the number of self-recovering of an electrode fixed with AuNS.
Figure 12C:
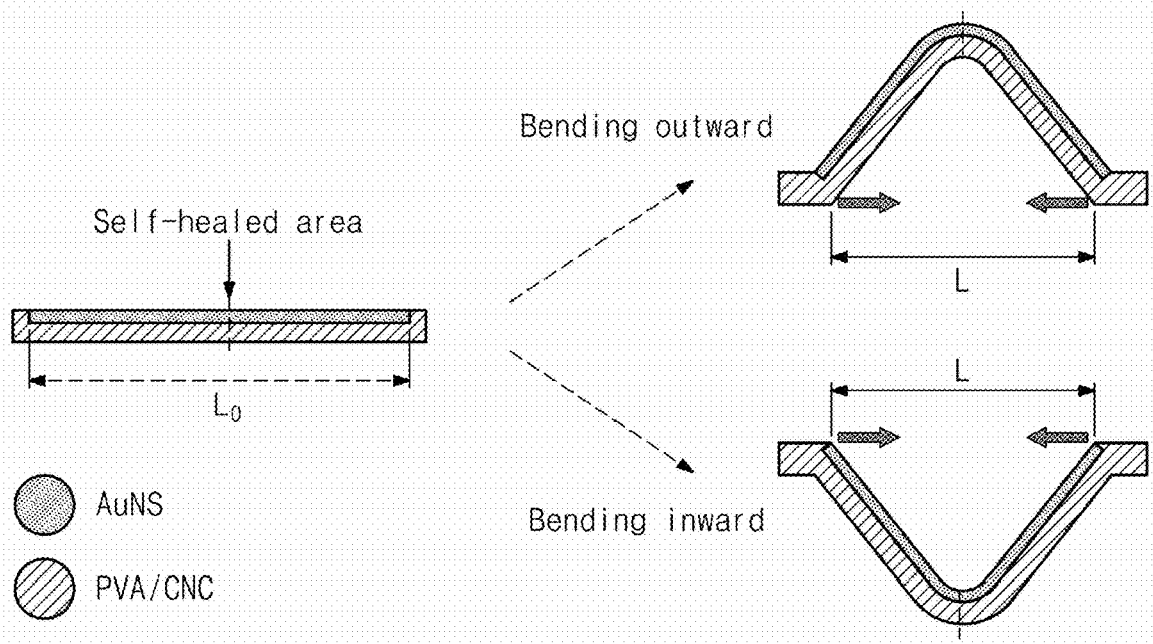
FIG. 12C is a diagram illustrating a method of measuring a resistance change depending on bending after self-recovering of an electrode fixed with AuNS.
Figure 12D:
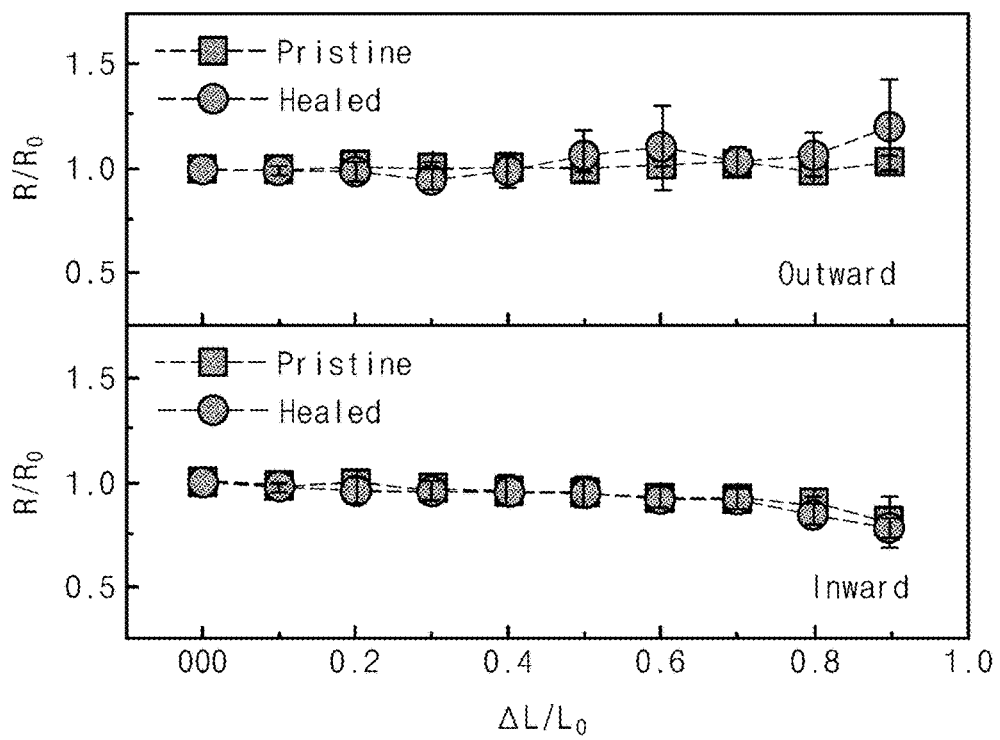
FIG. 12D is a graph illustrating a resistance depending on degree of bending of an electrode fixed with AuNS.
Figure 12E:
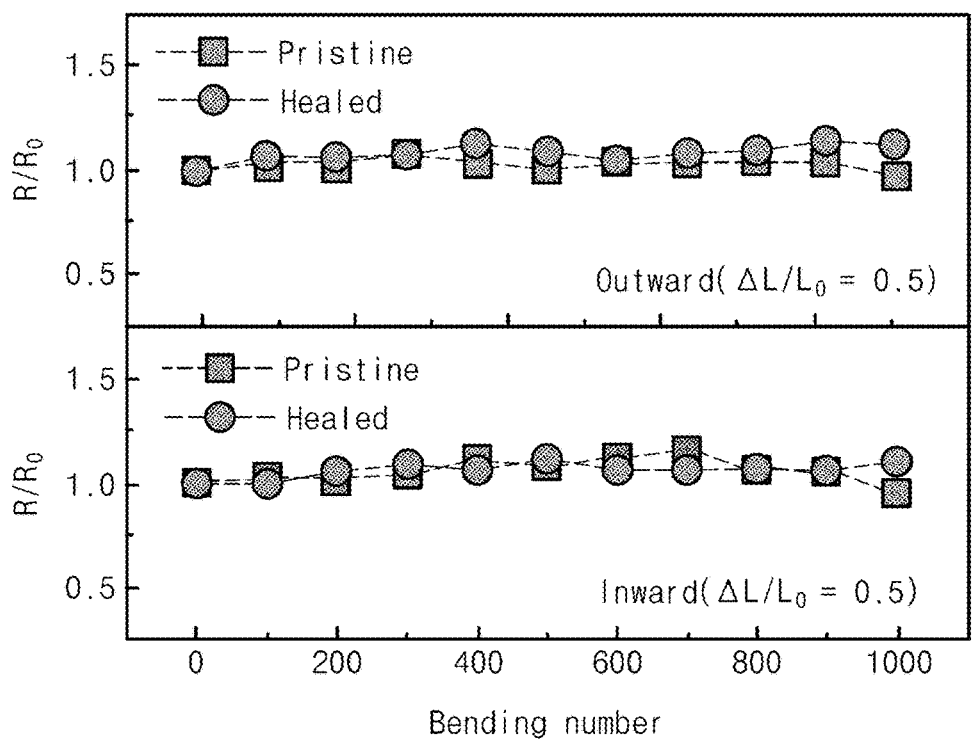
FIG. 12E is a graph illustrating a resistance change depending on the number of bending cycles of an electrode fixed with AuNS.

FIGS. 12A, 12B, 12C, 12D, and 12E are a diagram illustrating electrical self-recovering properties of a PVA/CNC-based electrode. FIG. 12A is an optical photo illustrating electrical self-recovering properties of an electrode fixed with AuNS and FIG. 12B is a graph illustrating a resistance change with regard to the number of self-recovering. FIG. 12C is a diagram illustrating a method of measuring a resistance change depending on bending after self-recovering and FIG. 12D is a graph illustrating a resistance depending on degree of bending. FIG. 12E is a graph illustrating a resistance change depending on the number of bending cycles of an electrode fixed with AuNS.

Referring to FIGS. 12A and 12B, it may be confirmed that the resistance change of the electrode depending on cutting and self-recovering cycle of the electronic device according to an embodiment of the inventive concept.

Through this, it may be confirmed that the electronic device according to an embodiment of the inventive concept may recover conductivity even after cutting and self-recovering, and the resistance of the electrode depending on the cycle does not change significantly.

In addition, referring to FIGS. 12C to 12E, it may be confirmed the resistance change of the electrode before and after self-recovering depending on the bending degree and bending cycle of the electronic device according to an embodiment of the inventive concept.

Through this, it may be seen that the electronic device according to the embodiment of the inventive concept does not significantly change the resistance of the electrode even when the bending degree and the bending cycle are increased.

FIGS. 13A to 13F are graphs illustrating characteristics of a supercapacitor according to an embodiment of the inventive concept.

Referring to FIGS. 13A to 13F, it may be seen that the supercapacitor according to the embodiment of the inventive concept exhibits similar characteristics to the generally manufactured supercapacitor.

Figure 13A:
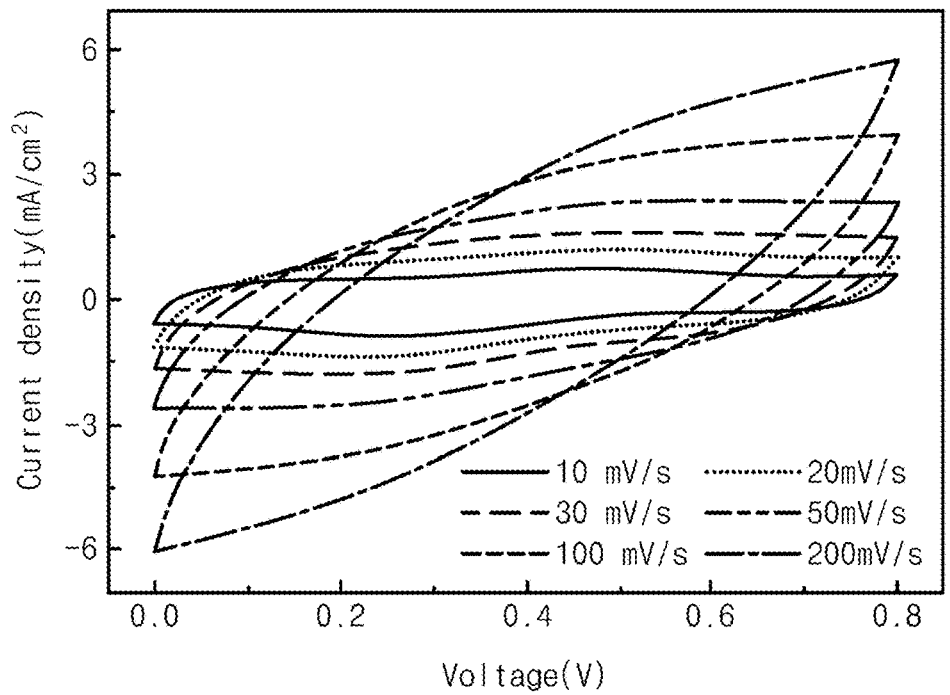
FIG. 13A is a cyclic voltammetry graph.
Figure 13B:
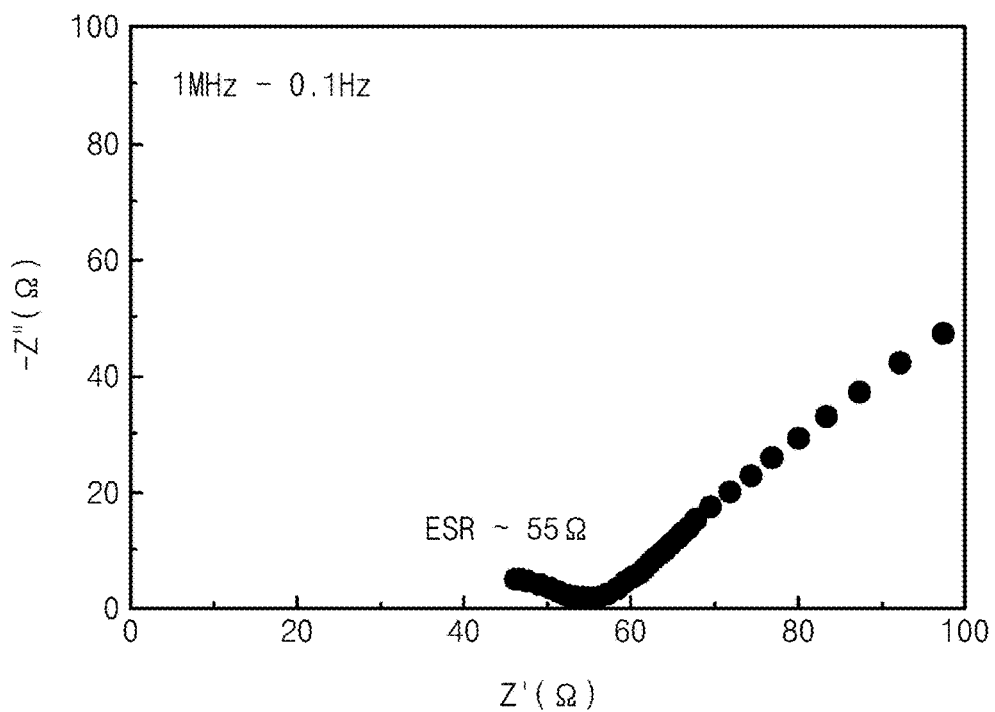
FIG. 13B is a nyquist plot graph.
Figure 13C:
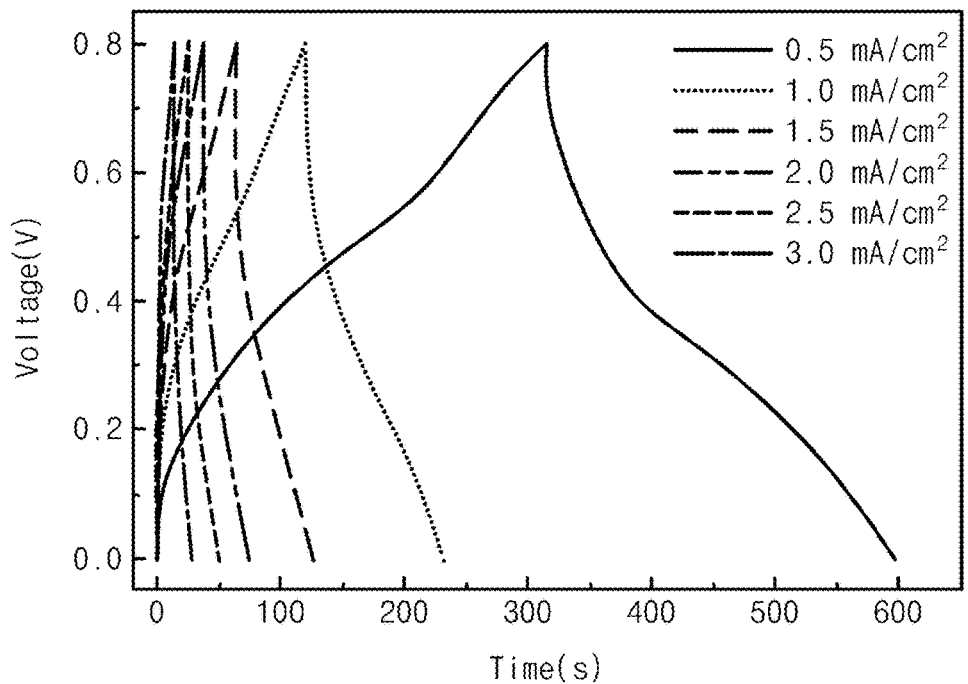
FIG. 13C is a graph illustrating electrochemical properties of a supercapacitor measured through a Galvanostatic charge-discharge method.
Figure 13D:
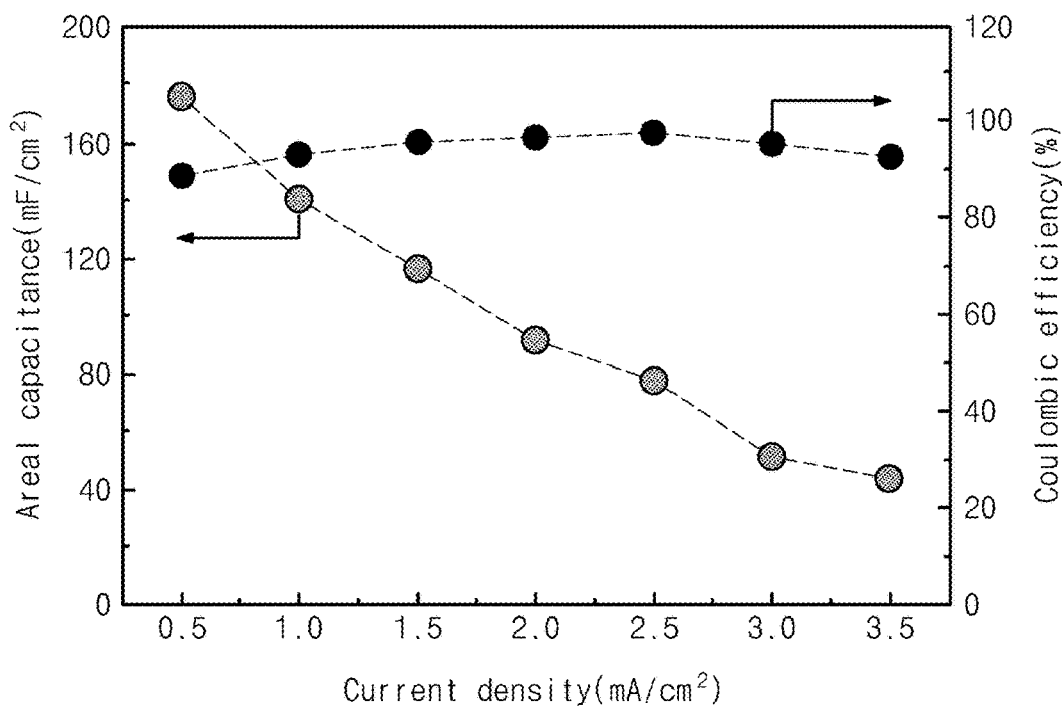
FIG. 13D is a graph of capacitance and charge/discharge efficiency per area of a supercapacitor depending on a driving current.
Figure 13E:
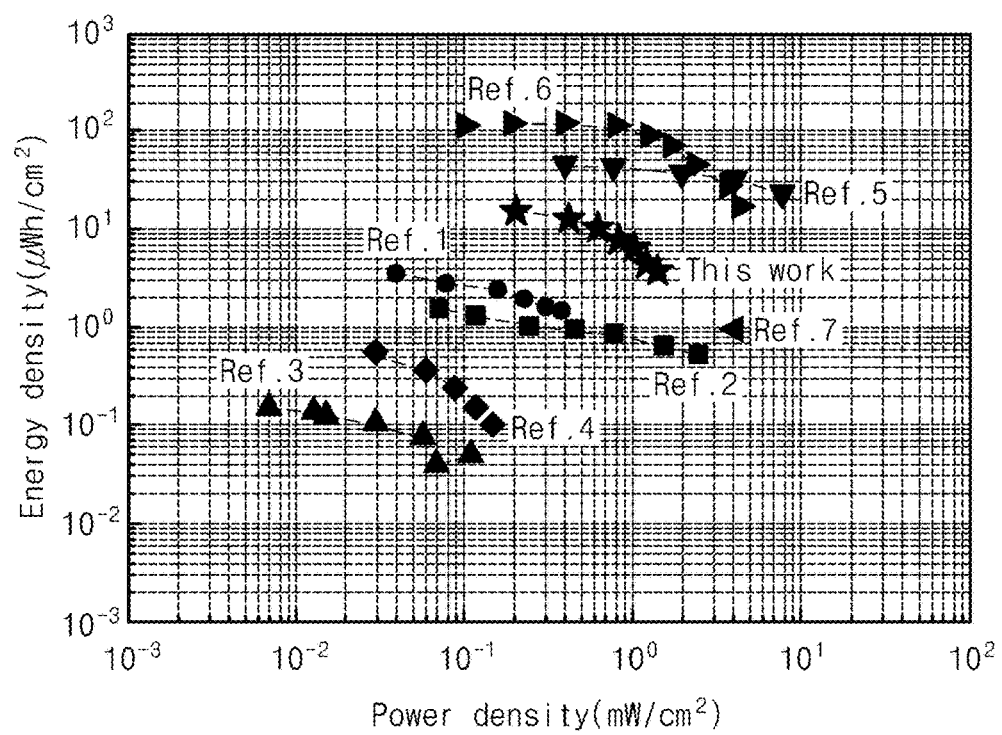
FIG. 13E is a ragon plot illustrating energy efficiency-power efficiency of a supercapacitor.
Figure 13F:
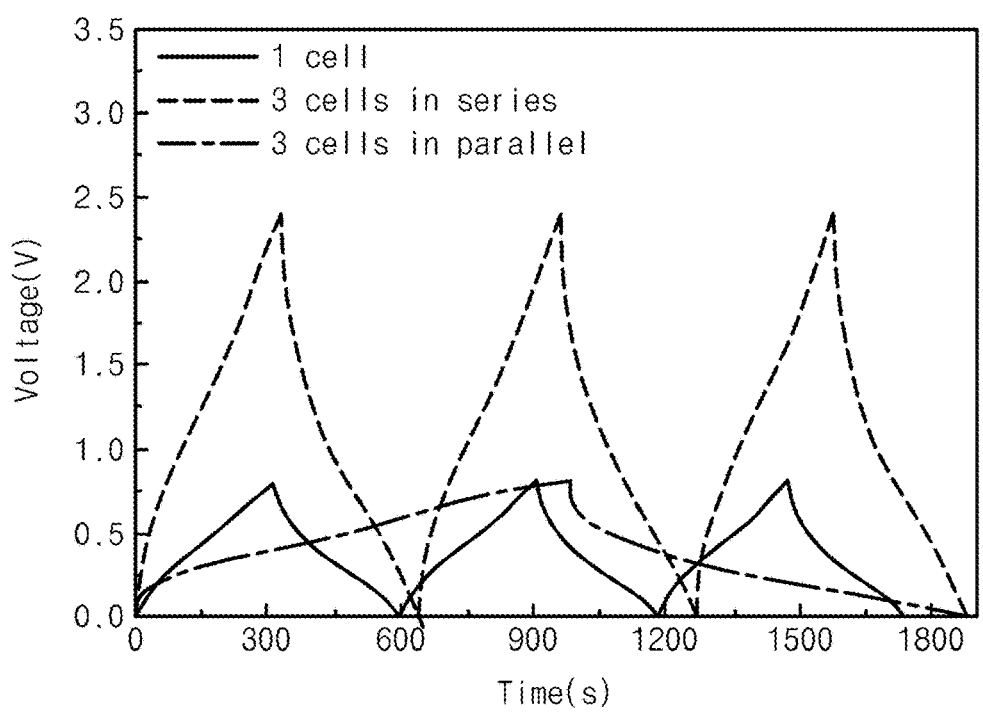
FIG. 13F is a graph confirming that supercapacitors are connected to and driven in three-series or in three-parallel to adjust capacitance and driving voltage.

Here, FIG. 13A is a cyclic voltammetry graph, FIG. 13B is a nyquist plot graph, FIG. 13C is a graph illustrating electrochemical properties of a supercapacitor measured through a Galvanostatic charge-discharge method, FIG. 13D is a graph of capacitance and charge/discharge efficiency per area of a supercapacitor depending on a driving current, FIG. 13E is a ragon plot illustrating energy efficiency-power efficiency of a supercapacitor, and FIG. 13F is a graph confirming that supercapacitors are connected to and driven in three-series or in three-parallel to adjust capacitance and driving voltage.

Figure 14A:
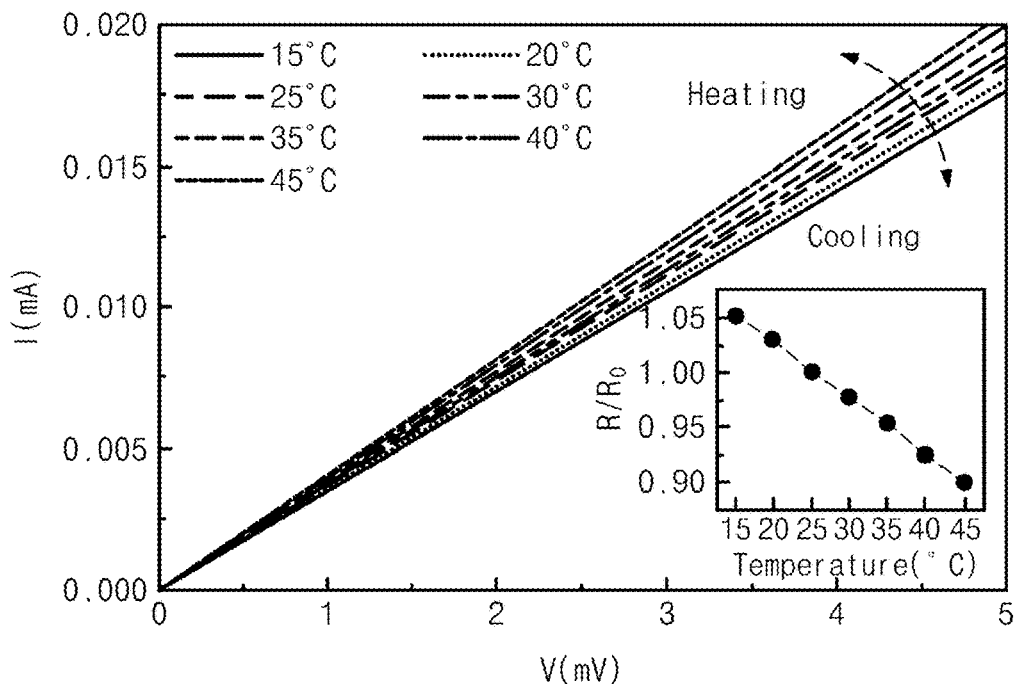
FIG. 14A is a graph illustrating a voltage-current diagram of a temperature sensor depending on temperature and a relative resistance of a device at each temperature (based on resistance at 25° C.)
Figure 14B:
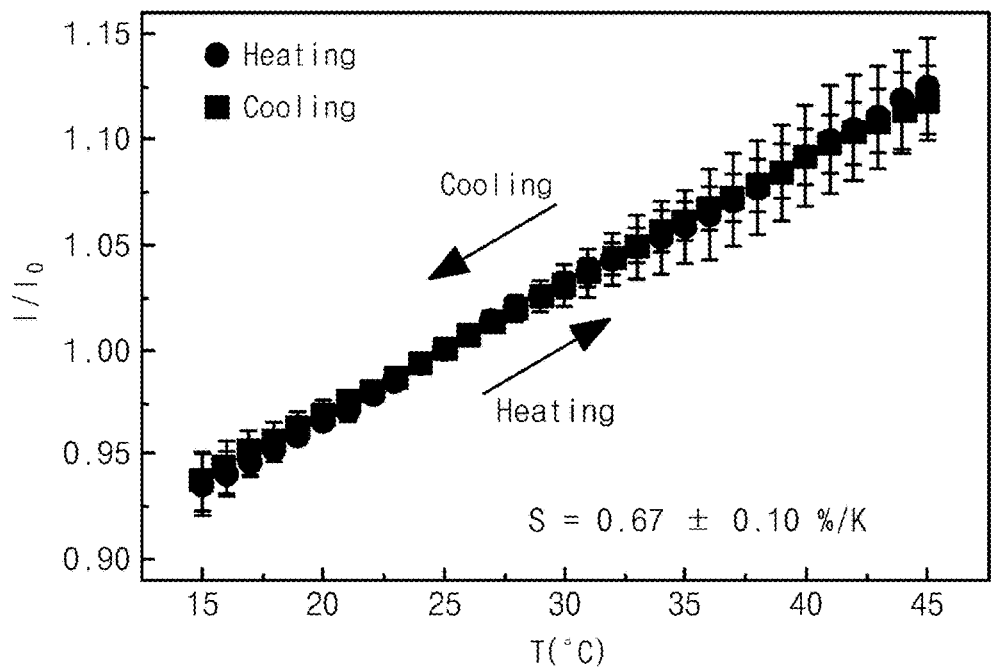
FIG. 14B is a graph normalizing a current amount flowing through a temperature sensor from 15° C. to 45° C. based on a current amount flowing at 25° C. when a constant voltage of 1V is applied.
Figure 14C:
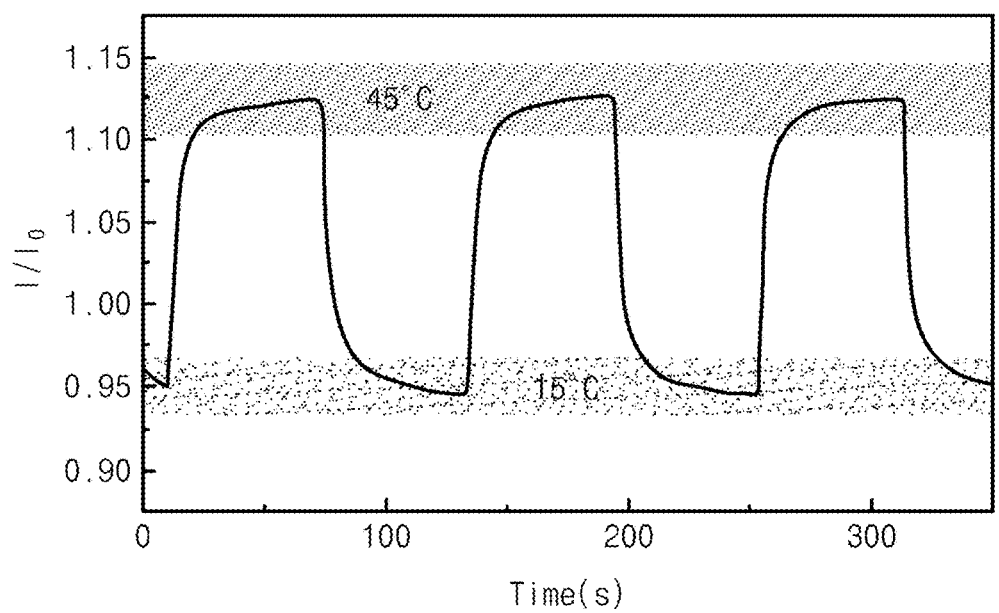
FIG. 14C is a graph illustrating a current change over time when a constant voltage of 1V is applied and stimuli of 15° C. and 45° C. are applied for 1 minute each.
Figure 14D:
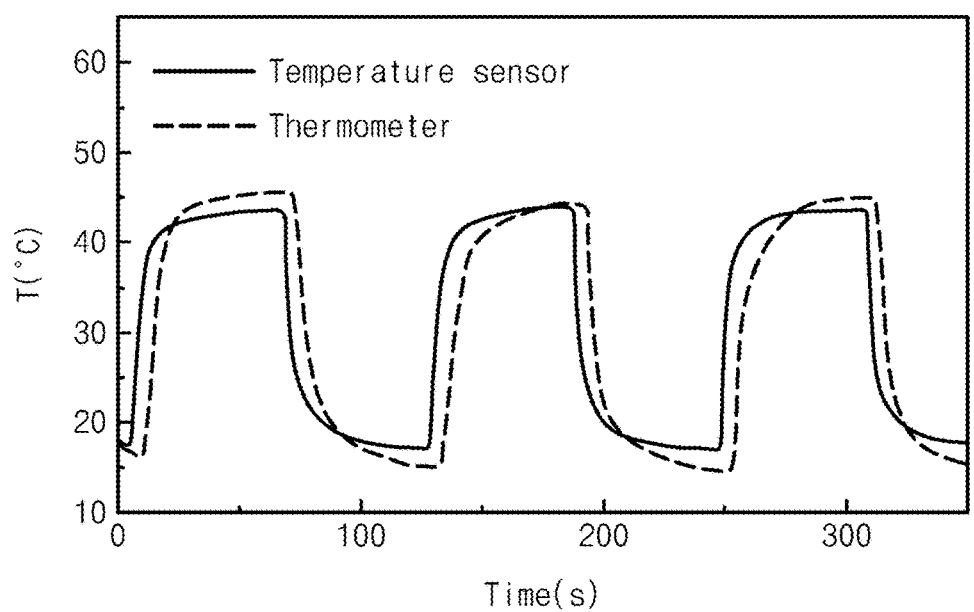
FIG. 14D is a graph illustrating conversion of FIG. 14C to temperature.
Figure 14E:
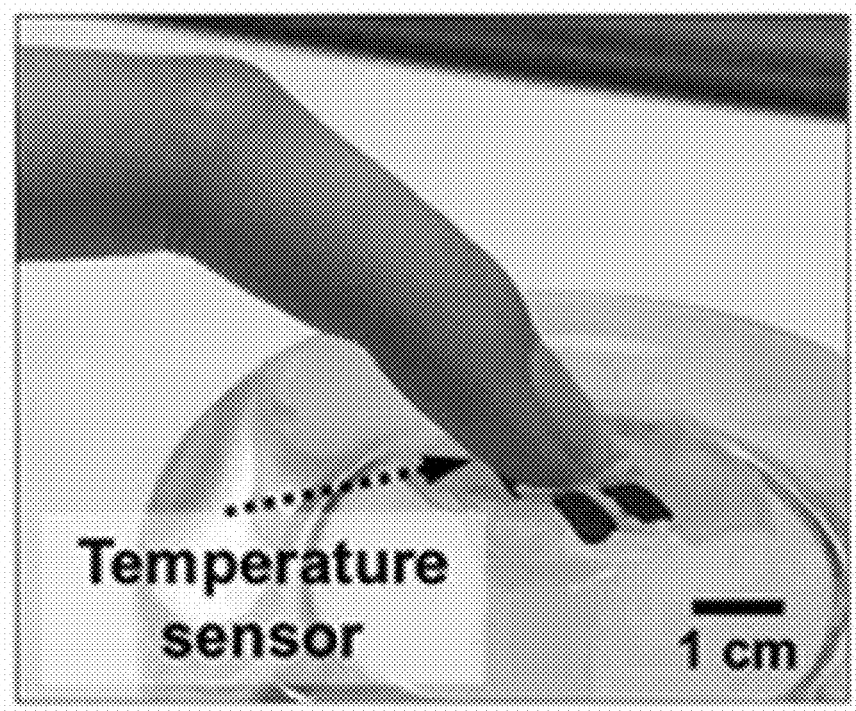
FIG. 14E is an image of touching a finger for 30 seconds while a temperature sensor is attached to a constant temperature bath fixed at 15° C. and a constant voltage of 1V is applied.
Figure 14F:
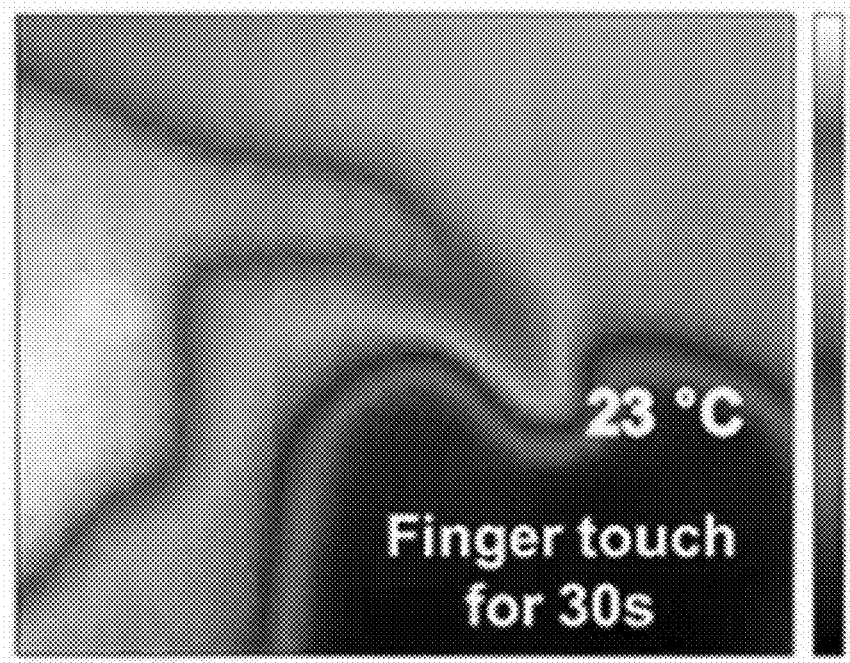
FIG. 14F is a thermal image in a situation of FIG. 14E.
Figure 14G:
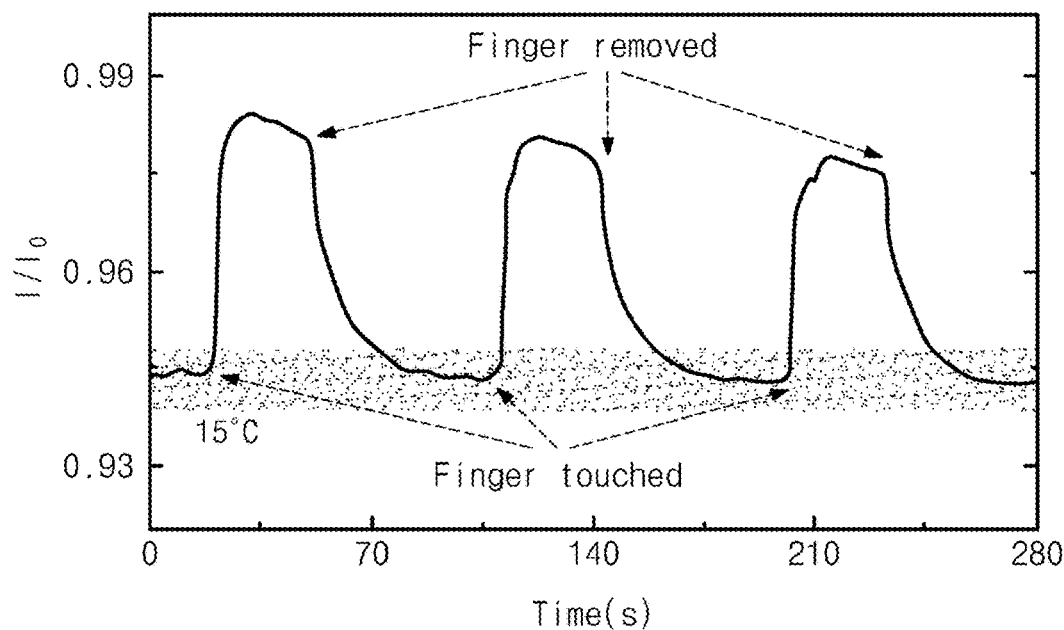
FIG. 14G is a graph illustrating a current amount change when touch and separation are repeated for 60 seconds in a situation of FIG. 14E.
Figure 14H:
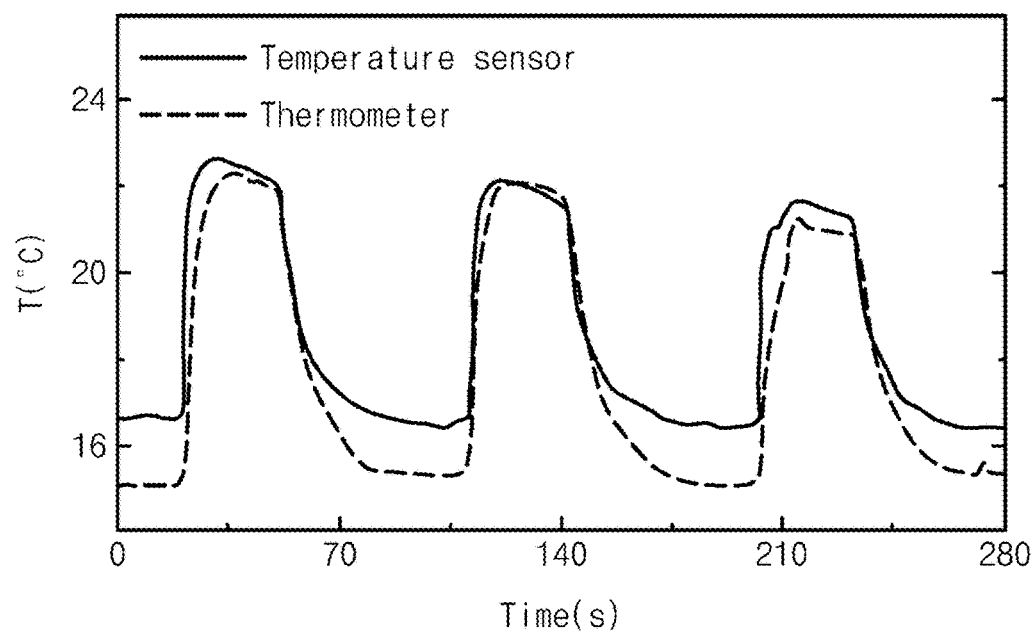
FIG. 14H is a graph of a temperature distribution plot illustrating conversion temperature of a result of FIG. 14G over time.

FIGS. 14A to 14H are graphs illustrating characteristics of a temperature sensor according to an embodiment of the inventive concept. Here, FIG. 14A is a graph illustrating a voltage-current diagram of a temperature sensor depending on temperature and a relative resistance of a device at each temperature (based on resistance at 25° C.), FIG. 14B is a graph normalizing a current amount flowing through a temperature sensor from 15° C. to 45° C. based on a current amount flowing at 25° C. when a constant voltage of 1V is applied, FIG. 14C is a graph illustrating a current change over time when a constant voltage of 1V is applied and stimuli of 15° C. and 45° C. are applied for 1 minute each, FIG. 14D is a graph illustrating conversion of FIG. 14C to temperature, FIG. 14E is an image of touching a finger for 30 seconds while a temperature sensor is attached to a constant temperature bath fixed at 15° C. and a constant voltage of 1V is applied, FIG. 14F is a thermal image in a situation of FIG. 14E, FIG. 14G is a graph illustrating a current amount change when touch and separation are repeated for 60 seconds in a situation of FIG. 14E, and FIG. 14H is a graph of a temperature distribution plot illustrating conversion temperature of a result of FIG. 14G over time.

Referring to FIGS. 14A and 14B, it may be confirmed that the temperature sensor according to an embodiment of the inventive concept has a sensitivity of 0.67%/K and an R square value of 0.999 to be linearly driven without distortion due to temperature.

FIGS. 14C and 14D are graphs illustrating the current change over time and temperature conversed from the current change when the constant voltage of 1V is applied and stimuli of 15° C. and 45° C. are applied for 1 minute each, and FIGS. 14E to 14H are a graph illustrating current amount change and the temperature distribution plot of the conversed temperature over time when touching the finger for 30 seconds and separating the finger for 60 seconds are repeated while the temperature sensor is attached to the constant temperature bath fixed at 15° C. and the constant voltage of 1V is applied.

Referring to FIGS. 14C to 14H, it may be confirmed that the temperature sensor according to an embodiment of the inventive concept exhibits an error of less than 1.5° C. in comparison with a temperature measured by an actual thermometer and is capable of measuring the temperature in real time.

FIGS. 15A, 15B, 15C, 15D, 15E, and 15F are a graph illustrating characteristics of a supercapacitor and a temperature sensor according to the embodiment of the inventive concept, and FIGS. 16A, 16B, 16C, 16D, 16E, and 16F are a graph illustrates characteristics of self-recovering of a supercapacitor and a temperature sensor according to the embodiment of the inventive concept.

Figure 15A:
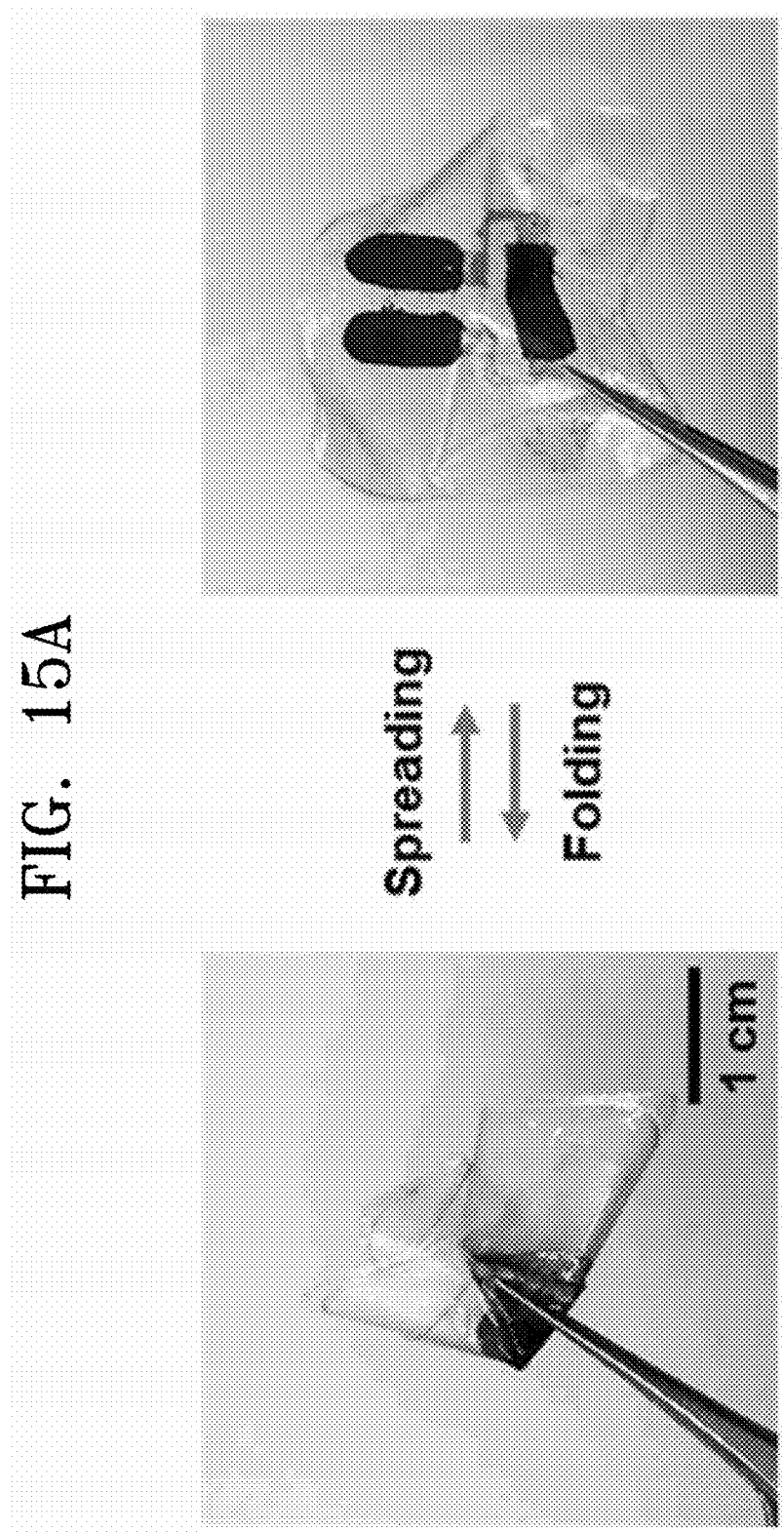
FIG. 15A is photographs of a prepared device in a crumpled and unfolded state.
Figure 15B:
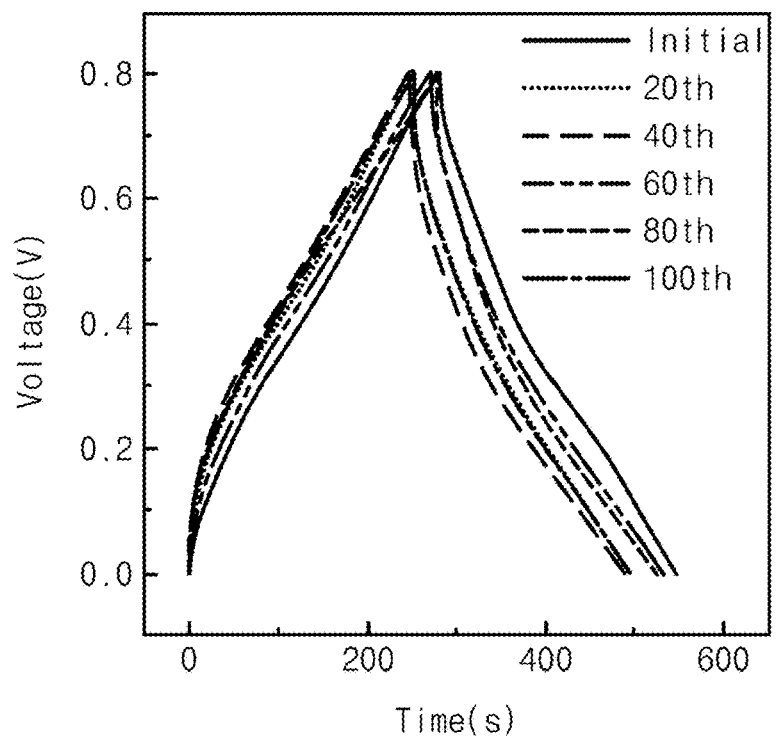
FIG. 15B is a constant Galvanostatic charge-discharge curve measured every 20 times when a supercapacitor is repeatedly crumpled 100 times in total.
Figure 15C:
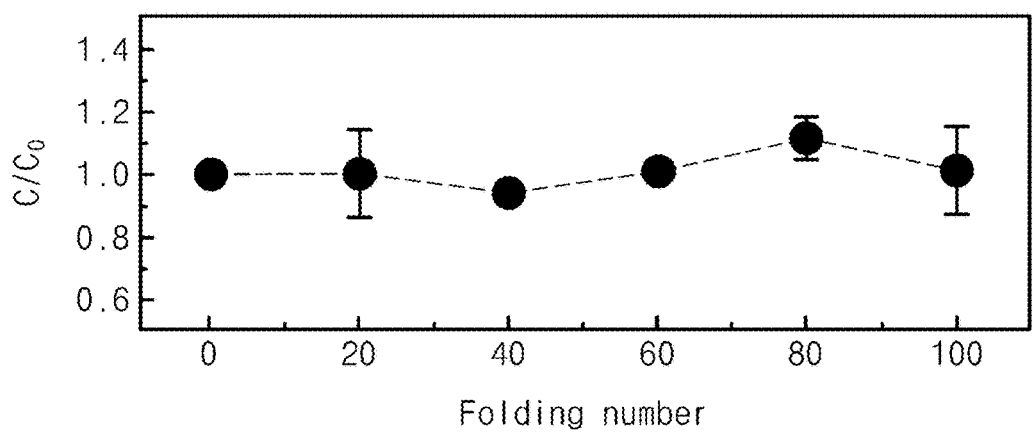
FIG. 15C is a graph of normalized capacitance measured every 20 times when a supercapacitor is repeatedly crumpled 100 times in total.
Figure 15D:
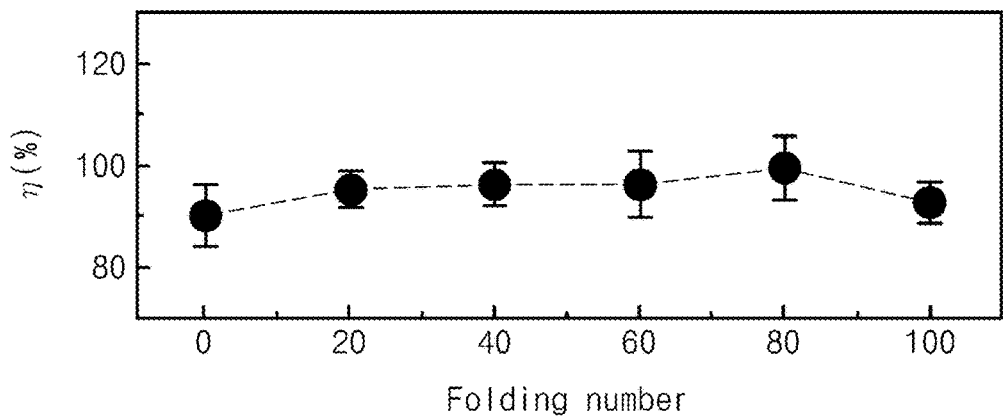
FIG. 15D is a graph of charging/discharging efficiency measured every 20 times when a supercapacitor is repeatedly crumpled 100 times in total.
Figure 15E:
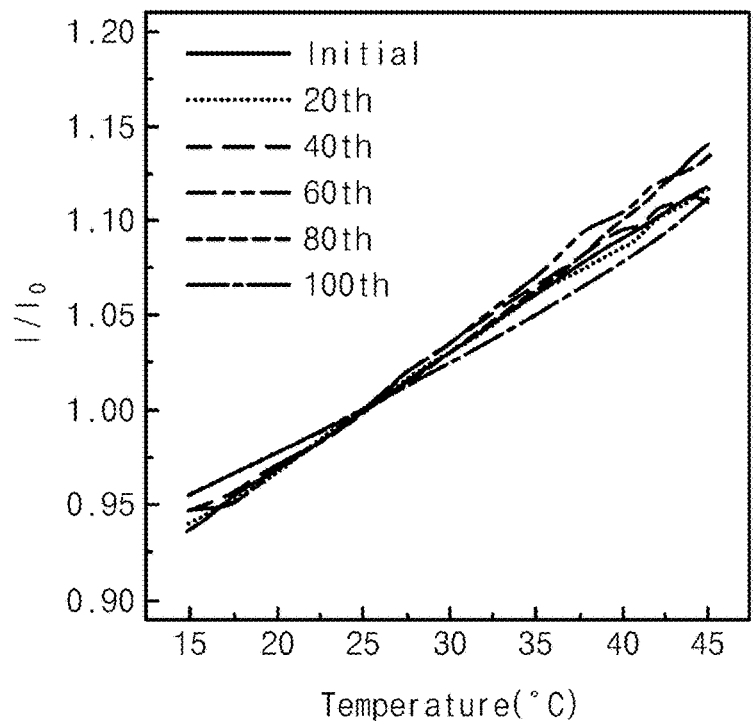
FIG. 15E is a graph measuring a current change amount depending on temperature every 20 times when a temperature sensor is repeatedly crumpled 100 times in total.
Figure 15F:
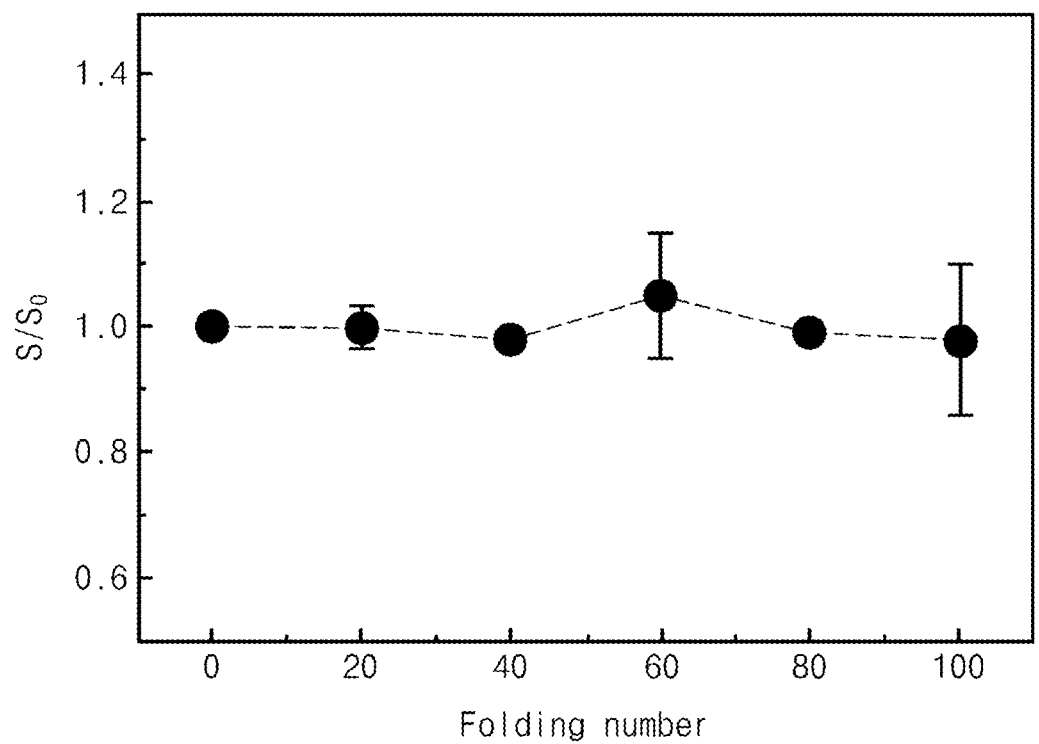
FIG. 15F is a graph measuring sensitivity change every 20 times change when a temperature sensor is repeatedly crumpled 100 times in total.

Here, FIG. 15A is photographs of a prepared device in a crumpled and unfolded state, FIG. 15B is a constant Galvanostatic charge-discharge curve measured every 20 times when a supercapacitor is repeatedly crumpled 100 times in total, FIG. 15C is a graph of normalized capacitance measured every 20 times when a supercapacitor is repeatedly crumpled 100 times in total, and FIG. 15D is a graph of coulombic efficiency measured every 20 times when a supercapacitor is repeatedly crumpled 100 times in total. FIG. 15E is a graph measuring a current change amount depending on temperature every 20 times when a temperature sensor is repeatedly crumpled 100 times in total and FIG. 15F is a graph measuring sensitivity change every 20 times change when a temperature sensor is repeatedly crumpled 100 times in total. Referring to FIGS. 15B to 15F, it may be seen that the electronic device according to an embodiment of the inventive concept exhibits stability for crumpling.

Figure 16A:
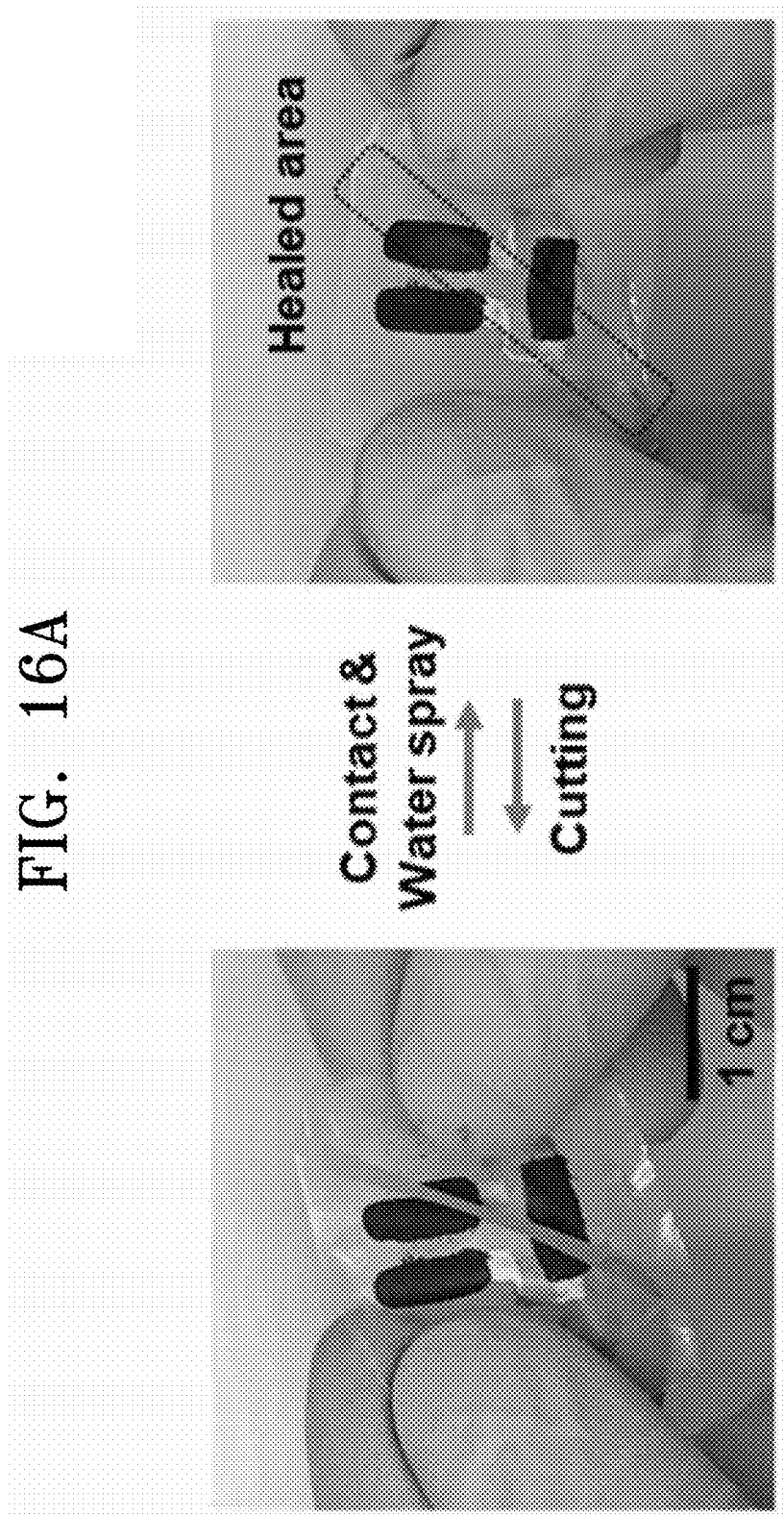
FIG. 16A is a photo of a state after cutting and performing self-recovering of a manufactured device.
Figure 16B:
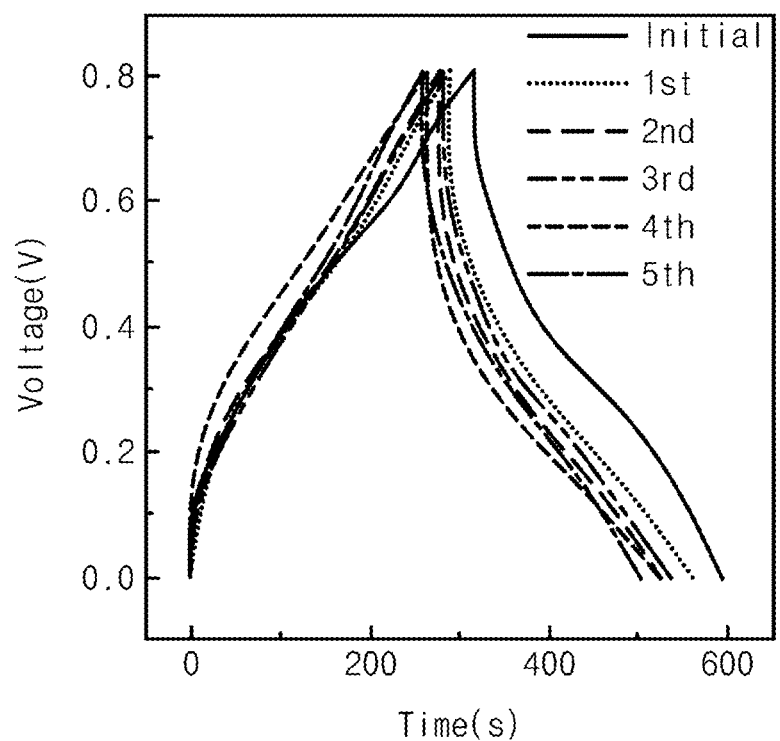
FIG. 16B is a Galvanostatic charge-discharge curve depending on each self-recovering cycle when self-recovering of a supercapacitor is performed 5 times in total.
Figure 16C:
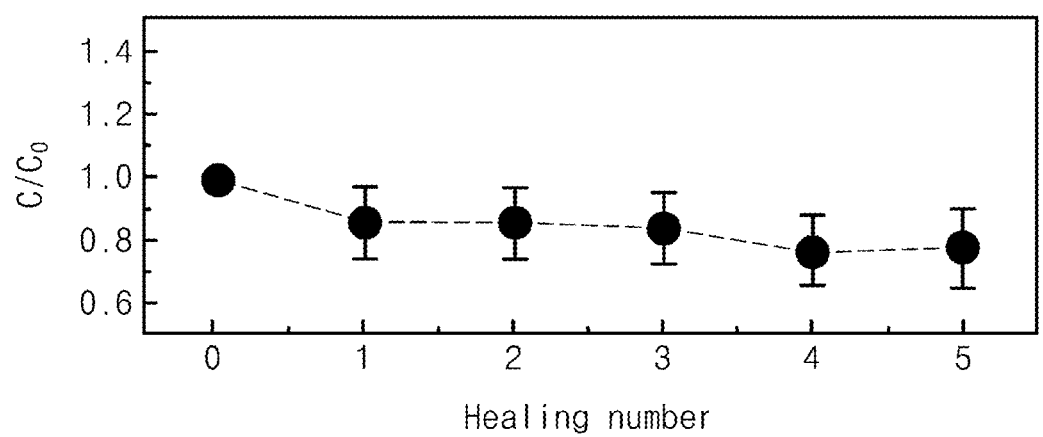
FIG. 16C is a graph of relative capacitance depending on each self-recovering cycle when self-recovering of a supercapacitor is performed 5 times in total.
Figure 16D:
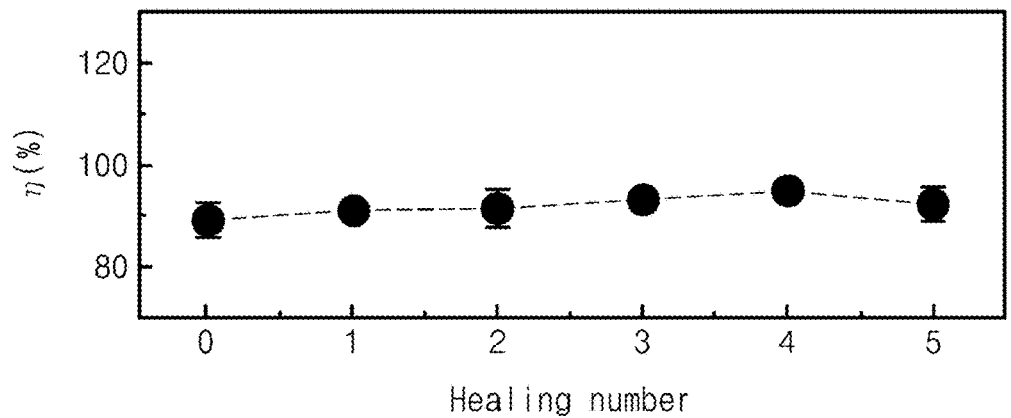
FIG. 16D is a graph of coulombic efficiency depending on each self-recovering cycle when self-recovering of a supercapacitor is performed 5 times in total.

In addition, FIGS. 16A, 16B, 16C, 16D, 16E, and 16F are a diagram illustrating characteristics change depending on a cutting and self-healing cycle of a fabricated device. FIG. 16A is a photo of a state after cutting and performing self-recovering of a manufactured device, FIG. 16B is a Galvanostatic charge-discharge curve depending on each self-recovering cycle when self-recovering of a supercapacitor is performed 5 times in total, FIG. 16C is a graph of relative capacitance depending on each self-recovering cycle when self-recovering of a supercapacitor is performed 5 times in total, and FIG. 16D is a graph of coulombic efficiency depending on each self-recovering cycle when self-recovering of a supercapacitor is performed 5 times in total.

Figure 16E:
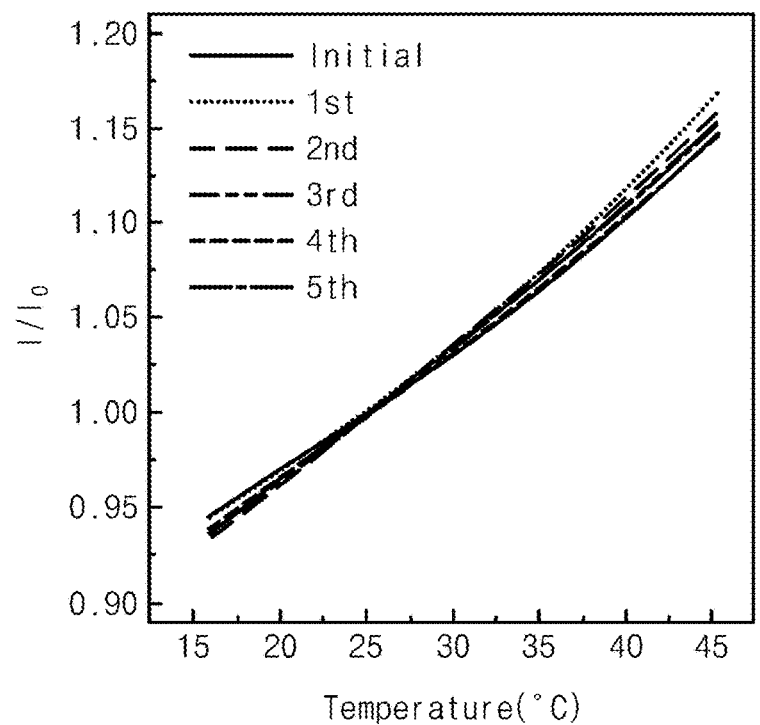
FIG. 16E is a graph measuring a current amount change for each self-recovering cycle when self-recovering of a temperature sensor is performed 5 times in total.
Figure 16F:
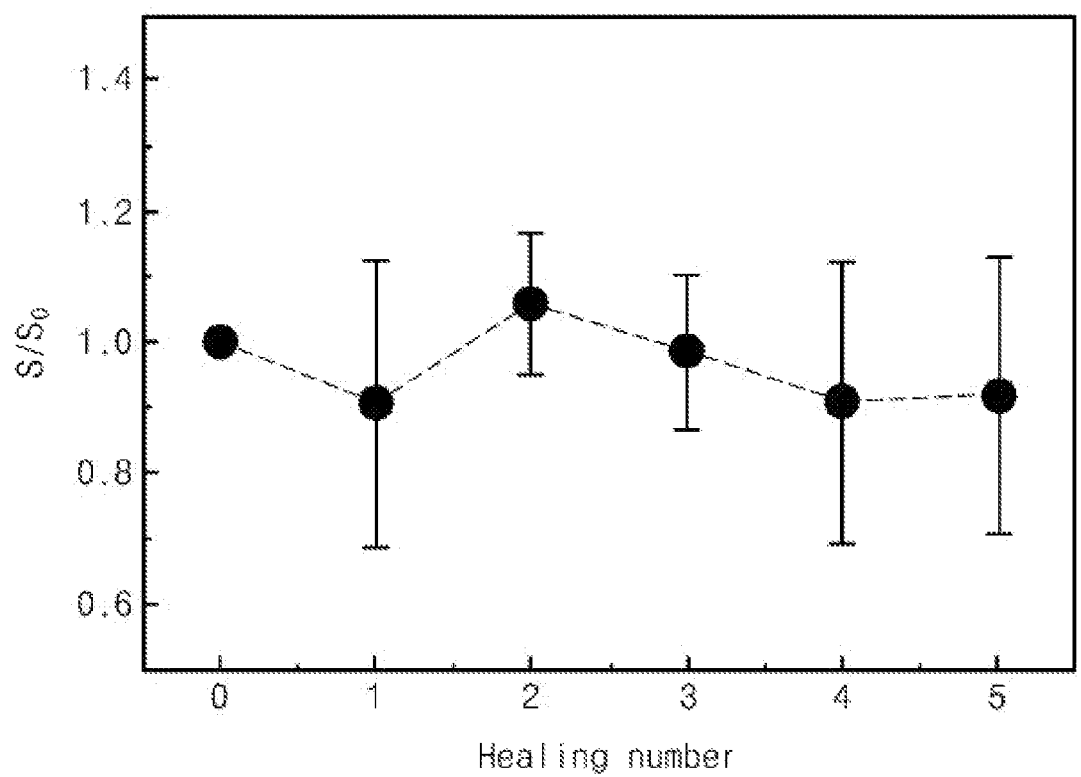
FIG. 16F is a graph measuring sensitivity change for each self-recovering cycle when self-recovering of a temperature sensor is performed 5 times in total.

FIG. 16E is a graph measuring a current amount change for each self-recovering cycle when self-recovering of a temperature sensor is performed 5 times in total and FIG. 16F is a graph measuring sensitivity change for each self-recovering cycle when self-recovering of a temperature sensor is performed 5 times in total.

Referring to FIGS. 16A to 16F, it may be seen that the electronic device according to an embodiment of the inventive concept exhibits self-recovering properties against damage due to cutting.

Figure 17:
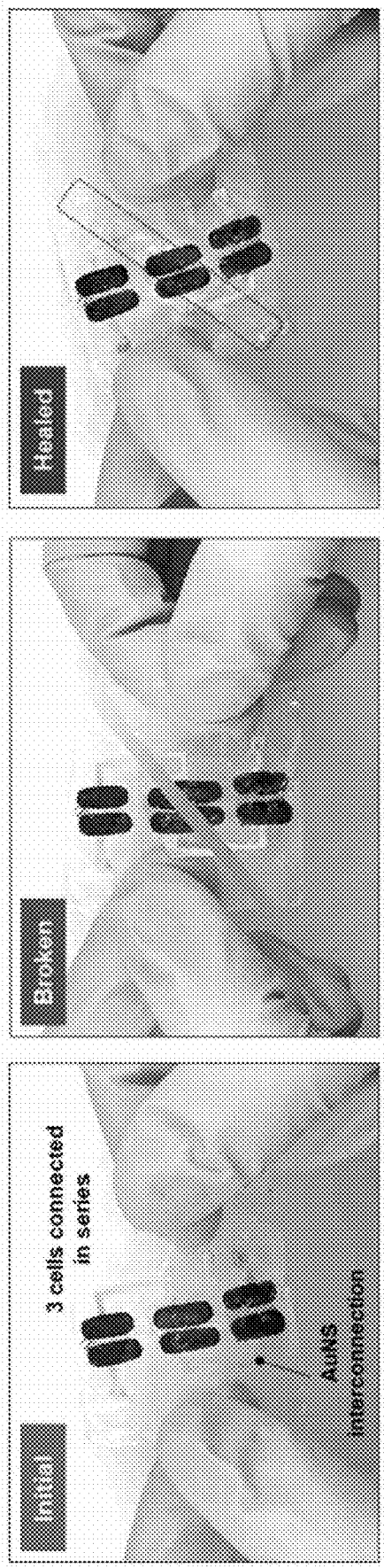
FIG. 17 is an image illustrating self-recovering properties of an electronic device including three supercapacitors connected in series in an embodiment of the inventive concept.
Figure 18:
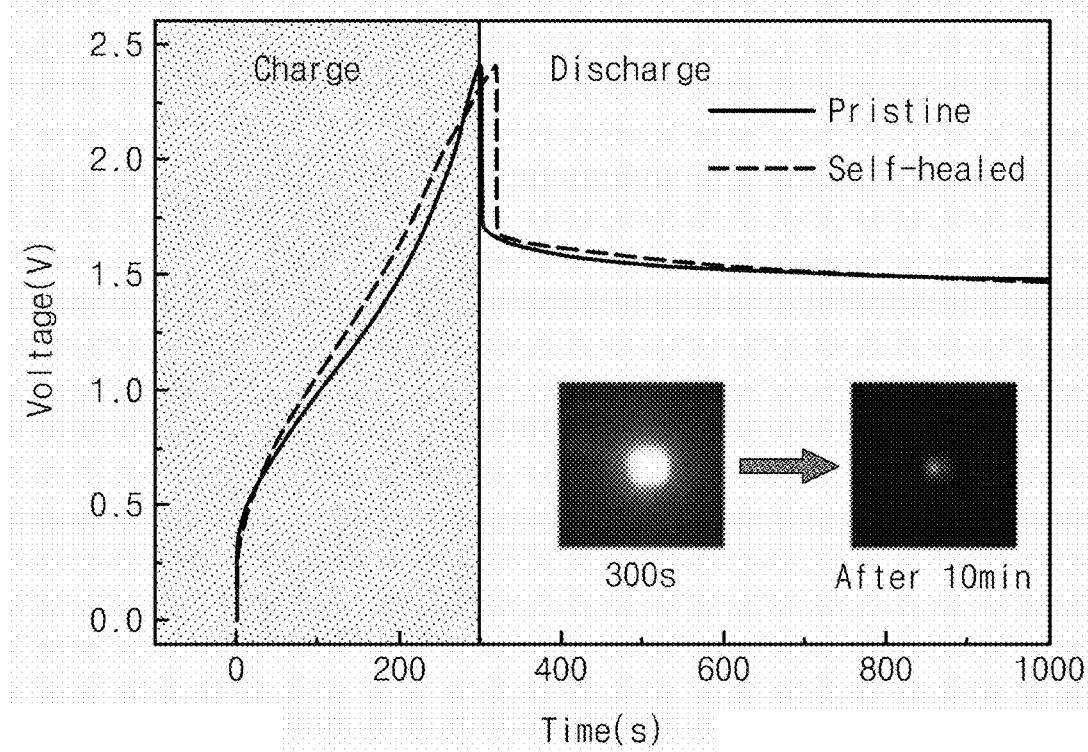
FIG. 18 is a graph illustrating LED driving before and after self-recovering in the electronic device of FIG. 17.

FIG. 17 is an image illustrating self-recovering properties of an electronic device including three supercapacitors connected in series in an embodiment of the inventive concept and FIG. 18 is a graph illustrating LED driving before and after self-recovering in the electronic device of FIG. 17.

Referring to FIG. 17, it may be confirmed that, when an electronic device according to an embodiment of the inventive concept is cut, water ($H_2O$) is applied and the cut device is self-healed to a state before connection is not separated physically and electrically.

Also, referring to FIG. 18, it may be confirmed that, when comparing the electronic device with self-recovering after being separated to the electronic device without self-recovering in the electronic device according to an embodiment of the inventive concept, the electrical properties are very similar to each other.

It may be confirmed that voltage increases during charging in both electronic devices, LED may be illuminated while being discharged, and voltage may be applied to the LED up to about 10 minutes.

According to an embodiment of the inventive concept, the self-recovering material may be introduced to extend the life of the device.

In addition, according to an embodiment of the inventive concept, the electronic device with the self-recovering properties, which controls the self-recovering properties of the self-recovering material to be expressed through the specific stimulus, may be provided to selectively control the self-recovering properties.

The above-described detailed descriptions are only examples of the present disclosure. In addition, the above-described descriptions have described exemplary embodiments of the present disclosure, and the present disclosure may be used in various other combinations, modifications, and environment. That is, the present disclosure may be changed and modified in a range of the concept and in an equivalent range of the content of the disclosure disclosed in the present specification and/or in technology or knowledge in the art. The described embodiments describe the best state for implementing the concept of the present disclosure, and various modifications required for applying the present disclosure to specific fields and uses may be possible. Accordingly, the above-describe detailed description of the present disclosure does not limit the present disclosure to the embodiments disclosed. In addition, the appended claims should be interpreted to include other embodiments.

What is claimed is:

1. An electronic device with self-recovering properties comprising:
    a substrate including a polymer composite;
    a conductive pattern disposed on the substrate; and
    an electrode disposed on the conductive pattern,
    wherein the polymer composite includes a composite of different first and second polymers,
    the first polymer includes a first functional group capable of forming a hydrogen bond between polymer chains, and
    the second polymer includes a second functional group capable of forming a hydrogen bond between polymer chains,
    wherein the substrate includes a first substrate and a second substrate that are physically separated, and
    wherein, when the first and second substrates are in contact with the each other and water ($H_2O$) is applied, the first substrate and the second substrate are physically coupled.

2. The electronic device with self-recovering properties of claim 1, wherein, when the water ($H_2O$) is applied, the substrate is phase-shifted to a hydrogel state.

3. The electronic device with self-recovering properties of claim 1, wherein the first and second functional groups of the first substrate respectively form a dynamic hydrogen bond with the first or second functional group of the second substrate.

4. The electronic device with self-recovering properties of claim 1, wherein the first polymer includes any one selected from the group consisting of polyvinyl including polyvinyl alcohol, polyvinyl foam, and polyvinyl acetal, polyester including polycarbonate, polyethylene terephthalate, and polybutylene terephthalate, polyolefin including polyethylene and polypropylene, unsaturated polycarboxylic acid including polyacrylic acid, polymethacrylic acid, and polycrotonic acid, and
    wherein the second polymer includes cellulose nanocrystal.

5. The electronic device with self-recovering properties of claim 1, wherein the polymer composite includes 5 wt % to 15 wt % of the second polymer.

6. The electronic device with self-recovering properties of claim 1, wherein, when the first substrate and the second substrate are physically coupled,
    the conductive pattern on the first substrate and the conductive pattern on the second substrate are electrically connected, and
    the electrode on the first substrate and the electrode on the second substrate are electrically connected.

7. The electronic device with self-recovering properties of claim 1, wherein the water ($H_2O$) is neutral and has a temperature range of 35° C. to 45° C.

8. The electronic device with self-recovering properties of claim 1, wherein the substrate has a thickness of 90 μm to 110 μm, wherein the conductive pattern has a thickness of 15 μm to 25 μm, and wherein the electrode has a thickness of 60 μm to 80 μm.

* * * * *